United States Patent
Kuhr et al.

(10) Patent No.: US 7,307,870 B2
(45) Date of Patent: Dec. 11, 2007

(54) MOLECULAR MEMORY DEVICES AND METHODS

(75) Inventors: Werner G. Kuhr, Denver, CO (US); Antonio R. Gallo, Colorado Springs, CO (US)

(73) Assignee: Zettacore, Inc., Englewood, CO (US)

( * ) Notice: Subject to any disclaimer, the term of this patent is extended or adjusted under 35 U.S.C. 154(b) by 30 days.

(21) Appl. No.: 11/246,874

(22) Filed: Oct. 7, 2005

(65) Prior Publication Data

US 2006/0092687 A1    May 4, 2006

Related U.S. Application Data

(63) Continuation of application No. 11/046,518, filed on Jan. 28, 2005, now abandoned, which is a continuation-in-part of application No. 10/766,304, filed on Jan. 28, 2004, now abandoned.

(51) Int. Cl.
    *G11C 11/00* (2006.01)
(52) U.S. Cl. .................. 365/151; 429/40; 429/149
(58) Field of Classification Search ............... 365/151; 429/40, 149
    See application file for complete search history.

(56) References Cited

U.S. PATENT DOCUMENTS

| | | | |
|---|---|---|---|
| 5,650,061 A |  | 7/1997 | Kuhr et al. |
| 5,923,525 A | * | 7/1999 | Belyakov et al. ............ 361/502 |
| 5,926,412 A |  | 7/1999 | Evans, Jr. et al. |
| 6,208,553 B1 | * | 3/2001 | Gryko et al. ............... 365/151 |
| 6,212,093 B1 |  | 4/2001 | Lindsey |
| 6,272,038 B1 | * | 8/2001 | Clausen et al. ............. 365/151 |
| 6,290,839 B1 |  | 9/2001 | Kayyem et al. |
| 6,324,091 B1 | * | 11/2001 | Gryko et al. ............... 365/151 |
| 6,381,169 B1 | * | 4/2002 | Bocian et al. .............. 365/151 |
| 6,451,942 B1 |  | 9/2002 | Li et al. |
| 6,484,394 B1 |  | 11/2002 | Heo et al. |
| 6,492,056 B1 | * | 12/2002 | Ovshinsky ................... 429/40 |
| 6,642,376 B2 |  | 11/2003 | Lindsey et al. |
| 6,657,884 B2 |  | 12/2003 | Bocian et al. |
| 6,674,121 B2 |  | 1/2004 | Misra et al. |
| 6,706,473 B1 | * | 3/2004 | Edman et al. ................. 435/6 |
| 6,728,129 B2 |  | 4/2004 | Lindsey et al. |
| 6,768,157 B2 | * | 7/2004 | Krieger et al. .............. 257/314 |

(Continued)

FOREIGN PATENT DOCUMENTS

WO    WO 01/03126 A2    1/2001

(Continued)

OTHER PUBLICATIONS

Roth, K. M., Thesis published in 2002, Chapter I overview pp. 1-285.

(Continued)

*Primary Examiner*—Viet Q. Nguyen
(74) *Attorney, Agent, or Firm*—Morgan, Lewis & Bockius LLP

(57) ABSTRACT

A molecular memory element comprising a switching device; at least a first bit line and a first word line coupled to said switching device; and an array of storage locations, each coupled to a bit line and a word line, said elements comprising a first electrode with storage molecules comprising redox active molecules, and said array comprising a second electrode.

17 Claims, 15 Drawing Sheets

U.S. PATENT DOCUMENTS

| | | | |
|---|---|---|---|
| 6,777,516 B2 | 8/2004 | Li et al. | |
| 6,853,472 B2 | 2/2005 | Warner et al. | |
| 6,855,417 B2 | 2/2005 | McCreery | |
| 6,855,950 B2 | 2/2005 | McCreery | |
| 6,921,475 B2* | 7/2005 | Kuhr et al. | 205/775 |
| 6,944,047 B2* | 9/2005 | Rotenberg et al. | 365/151 |
| 6,958,270 B2* | 10/2005 | Misra et al. | 438/257 |
| 7,005,237 B2 | 2/2006 | Lindsey | |
| 7,019,391 B2* | 3/2006 | Tran | 257/678 |
| 7,032,277 B2 | 4/2006 | Rolla et al. | |
| 7,042,755 B1 | 5/2006 | Bocian et al. | |
| 7,061,791 B2 | 6/2006 | Bocian et al. | |
| 7,074,519 B2* | 7/2006 | Kuhr et al. | 429/149 |
| 2001/0010654 A1 | 8/2001 | Jeng-Jye | |
| 2002/0105897 A1 | 8/2002 | McCreery et al. | |
| 2002/0180446 A1 | 12/2002 | Kuhr et al. | |
| 2003/0081463 A1 | 5/2003 | Bocian et al. | |
| 2003/0082444 A1 | 5/2003 | Kuhr et al. | |
| 2004/0007758 A1 | 1/2004 | McCreery | |
| 2004/0115524 A1 | 6/2004 | Misra et al. | |
| 2004/0120180 A1 | 6/2004 | Rotenberg et al. | |
| 2004/0150465 A1 | 8/2004 | Nishida et al. | |
| 2004/0151912 A1 | 8/2004 | McCreery | |
| 2005/0207208 A1 | 9/2005 | Bocian et al. | |

FOREIGN PATENT DOCUMENTS

| | | |
|---|---|---|
| WO | WO 03/052835 A1 | 6/2003 |
| WO | WO 03/071552 A | 8/2003 |

OTHER PUBLICATIONS

Luyken, R. J., et al., "Concepts for hybrid CMOS-molecular non-volatile memories" Nanotechnology IOP Publishing UK., vol. 14, No. 2, 2003, pp. 273-276.

Kwok, K. S., "Materials for future electronics" *Materials Today, Elsevier Science*, Kidlington, GB, vol. 6, No. 12, Dec. 2003, pp. 20-27.

Gowda, et al., "Hybrid silicon/molecular memories-co-engineering for novel functionality" *International Electron Devices Meeting 2003 IEDM. Technical Digest.*, Washington, DC, Dec. 8-10, 2003, New York, NY:IEEE, US, pp. 537-540.

Roth K. M., et al. "Measurement of Electron-Transfer Rates of Charge-Storage Molecular Monolayers On Si(100). Toward Molecular/Semiconductor Information Storage Devices", *J. Am. Chem. Soc.; Journal of the American Chemical Society* Jan. 15, 2003, vol. 125, No. 2, Jan. 15, 2003, pp. 505-517.

Gittins, et al., "A nonmetre-scale electronic switch consisting of a metal cluster and redox-addressable groups" *Nature, MacMillan Journals, Ltd.*, London, GB, vol. 408, Nov. 2, 2000, pp. 67-69.

Nishida Y., et al. "An Interpolating Sense Circuit for Molecular Memory", *Department of Electrical and Computer Engineering, CICC 2002*, 4 pp.

Schweikart, K-H, et al., "Design, synthesis, and characterization of prototypical multistate counters in three distinct architectures", *J. Mater. Chem.*, 2002, 12(4), pp. 808-828.

Ccc™ Spincoaters, Brewer Science, http://www.brewerscience.com/cee/products/cee100.html 8 pp. 2007.

"Bake Process Theory", *Cost Effective Equipment*, 4 pp. 2007.

MBraun, Inertgas Technology, MB OX-SE-3 Oxygen Probe, (no date), www.mbraun.com, 4 pp.

"Spin Coat Theory", Cost Effective Equipment, 6 pp. 2007.

"Spin Coating Patent Index", http://www.mse.arizona.edu/faculty/birnie/Coatings/PatenNdx.htm, Apr. 12, 2005, 10 pp.

Primaxx website pages, http://www.primaxxinc.com/products.htm, Apr. 12, 2005, 30 pp.

P. Mumbauer, et al. "Mist Deposition in Semiconductor Device Manufacturing", Nov. 1, 2004, http://www.reed-electronics.com/semiconductor/index.asp?layout=articlePrint&articleID=CA476 . . . , 7 pp.

Xiangfeng D., et al. "Nonvolatile Memory and Programmable Logic from Molecule-Gated Nanowires", *Nanoletters* 2(5) (2002), pp. 487-490.

Li, C., et al. "Data Storage Studies on Nanowire Transistors with Self-Assembled Porphyrin Molecules", *J. Phys. Chem. B. 2004*, 108, pp. 9646-9649.

Roth K. M., et al. "Molecular Approach Toward Information Storage Based on the Redox Properties of Porphyrins in Self-Assembled Monolayers", *J. Vac. Sci. Tech. B 2000*, 18, pp. 2359-2364.

Gryko, D., et al., "Synthesis of"Porphyrin-Linker-Thiol", Molecules with Diverse Linkers for Studies of Molecular-Based Information Storage", *J.Org. Chem. 2000*, 65, pp. 7345-7355.

Gryko, D., et al., "Synthesis of Thiol-Derivatized Ferrocene-Porphyrins for Studies of Multibit Information Storage", *J. Org. Chem. 2000*, 65, pp. 7356-7362.

Clausen C.,et al., "Synthesis of Thiol-Derivatized Porphyrin Dimers and Trimers for Studies of Architectural Effects on Multibit Information Storage", *J. Org. Chem. 2000*, 65, pp. 7363-7370.

Clausen C., et al., "Investigation of Tightly Coupled Porphyrin Arrays Comprised of Identical Monomers for Multibit Information Storage," *J. Org. Chem. 2000*,65, pp. 7371-7378.

Li J., "Synthesis of Thiol-Derivatized Europian Porphyrinic Triple-Decker Sandwich Complexes for Multibit Molecular Information Storage", *J. Org. Chem. 2000*, 65, pp. 7379-7390.

Gryko D. et al., "Thiol-Derivatized Porphyrins for Attachment to Electoactive Surfaces", *J. Org. Chem. 1999*,64, pp. 8635-8647.

Gryko, D. "Studies Related to the Design and Synthesis of a Molecular Octal Counter", *J. Mat. Chem.*, 2001, 11(4), pp. 1162-1180.

Roth K. M., et al., Characterization of Charge Storage in Redox SAMs, *Langmuir,* 2002, 18(10): pp. 4030-4040.

Roth K. M., et al., "Comparison of Electron-Transfer and Charge-Retention Characteristics of Porphyrin-Containing Self-Assembled Monolayers Designed for Molecular Information Storage", *J. Phys. Chem. B.*, 2002, 106, pp. 8639-8648.

Liu, Z., et al., "Molecular Memories That Survive Silicon Device Processing and Real-World Operation", *Science* vol. 302, Nov. 28, 2003, pp. 1543-1545.

Roth K. M., "Charge-Retention Characteristics of Self-Assembled Monolayers of Molecular-Wire-Linked Porphyrins on Gold", *American Chemical Society*, 2003, pp. 51-61.

Seth et al. "Investigation of Electronic Communication in Multi-Porphyrin Light-Harvesting Arrays", (1994) *J. Am. Chem. Soc.*, 116: pp. 10578-10592.

Seth et al Soluble Synthetic Multiporphyrin Arrays. 3. Static Spectroscopic and Electrochemical Probes of Electronic Communication, (1996), *J. Am. Chem. Soc.*, 118: pp. 11194-11207.

Strachan et al. "Effects of Orbital Ordering on Electronic Communication in Multiporphyrin Arrays" (1997), *J. Am. Chem. Soc.*, 119: pp. 11191-11201.

Li et al. "Effects of Central Metal ion (Mg, Zn) and Solvent on Singlet Excited-State Energy Flow in Porphyrin-Based Nanostructures", (1997), *J. Mater. Chem.*, 7: pp. 1245-1262.

Strachan et al. "Synthesis and Characterization of Tetrachlorodiarylethyne-Linked Porphyrin Dimers. Effects of Liner Architecture on Intradimer Electronic Communication" (1998), *Inorg. Chem.*, 37: pp. 1191-1201.

Yang et al. Interplay of Orbital Tuning and Linker Location in Controlling Electronic Communication in Porphyrin Arrays (1999), *J. Am. Chem. Soc.*, 121: pp. 4008-4018.

Roth et al. Molecular Approach Toward Information Storage Based on the Redox Properties of Porphyrins in Self-Assembled Monolayers, (2000) *Vac. Sci. Technol. B 18*: pp. 2359-2364.

Roth et al. "Measurements of Electron-Transfer Rates of Charge-Storage Molecular Monolayers on Si(100). Toward Hybrid Molecular/Semiconductor Information Storage Devices" (2003), *J. Am. Chem. Soc. 125*: pp. 505-517.

Advanced Inorganic Chemistry, 5th Ed., Cotton & Wilkinson, John Wiley & Sons, 1988, chapter 26.

Advanced Organic Chemistry, 5th Edition, Cotton & Wilkenson, John Wiley & Sons, 1988, p. 38.

Organometallics, A Concise Introduction, Elschenbroich et al., 2nd Ed., 1992, VCH.

Comprehensive Organometallic Chemistry II, A Review of the Literature 1982-1994, Abel et al. Ed., vol 7, Chapters 7, 8, 10 & 11, Pergamon Press.

Robbins et al., "Syntheses and Electronic Structures of Decamethylmetallocenes", (1982), *J. Am. Chem. Soc. 104*: pp. 1882-1893.

Gassman et al., "(Trifluoromethyl) cyclopentadienide: A Powerful Electron-Withdrawing Ligand for Transition-Metal Complexes", (1986), *J. Am. Chem. Soc. 108*: pp. 4228-4229.

Connelly et al., "Chemical Redox Agents for Organometallic Chemistry", *Chem. Rev.* (1996) 96: pp. 877-910.

Geiger et al., "The Electron-Transfer Reactions of Polynuclear Organotransition Metal Complexes", Advances in Organometallic Chemistry 24: p. 87-130, 2007.

Jiang et al. "Double-decker Yttrium(III) Complexes with Phthalocyaninato and Porphyrinato Ligands", J. Porphyrins Phthalocyanines (1999) 3: pp. 322-328.

Arnold et al. "Mixed Phthalocyaninato-Porphyrinato Europium(III) Triple-decker Sandwich Complexes Containing a Conjugated Dimeric Porphyrin Ligand", Chemistry Letters (1999), pp. 483-484.

\* cited by examiner

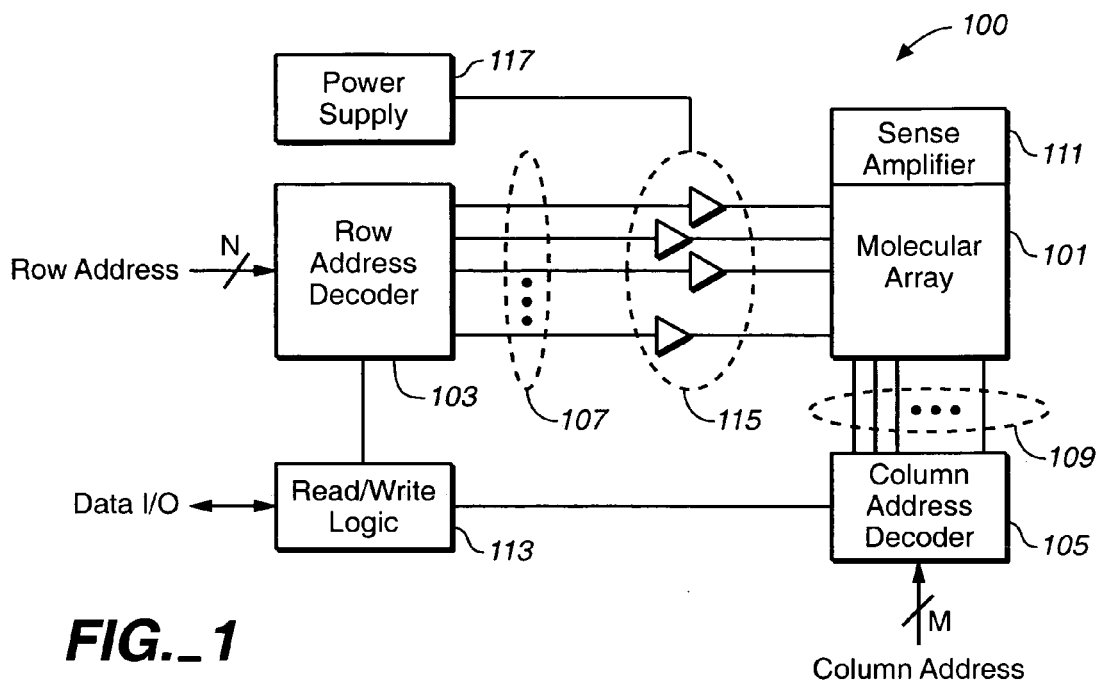
FIG._1
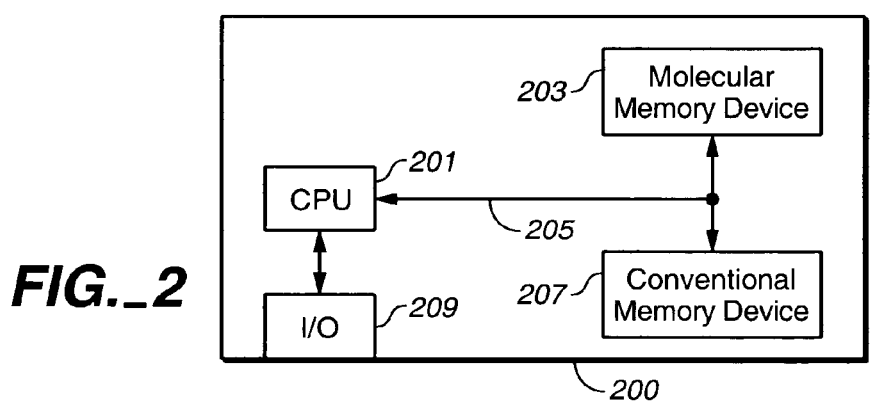
FIG._2
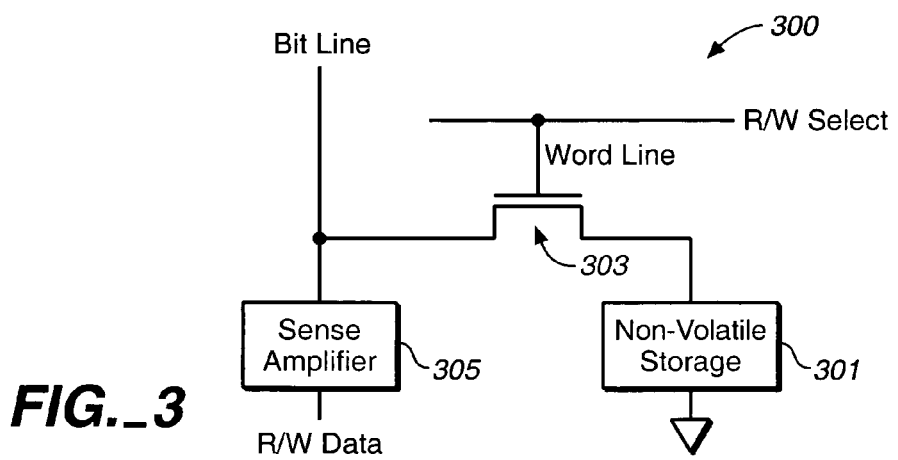
FIG._3

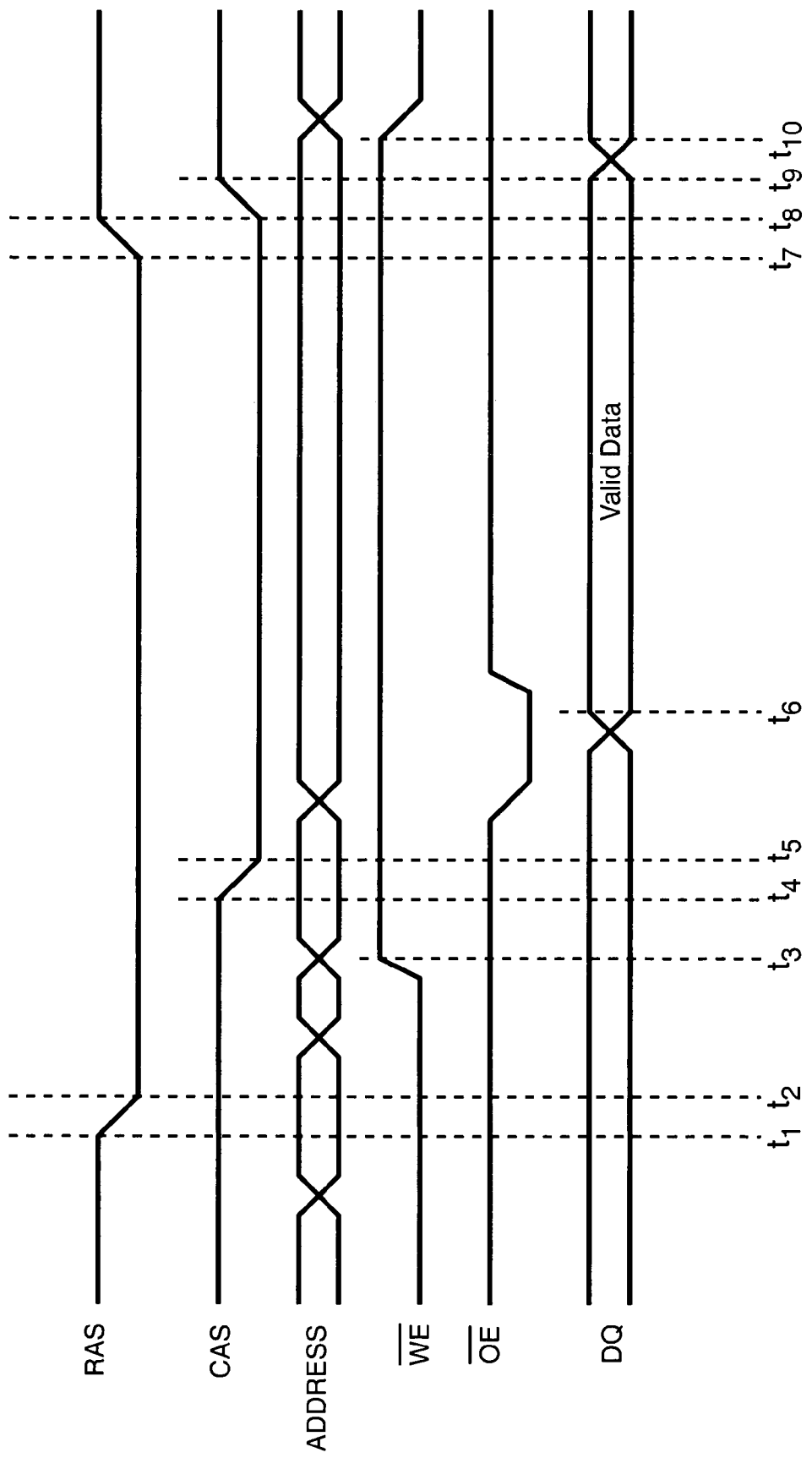
FIG._4

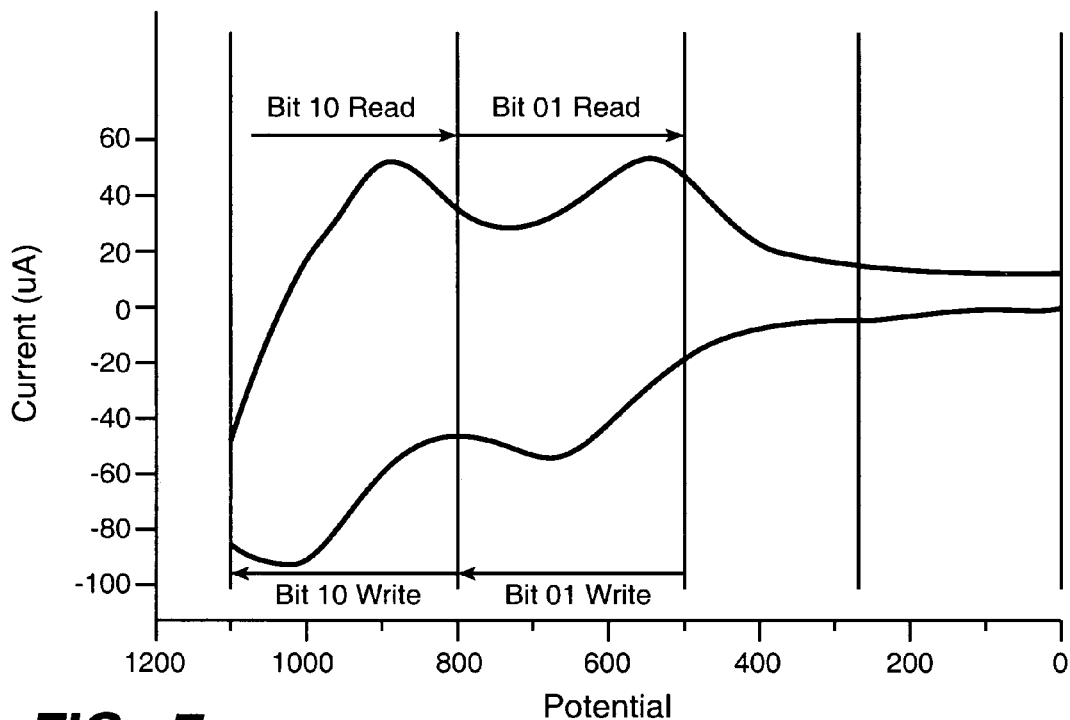
FIG._7
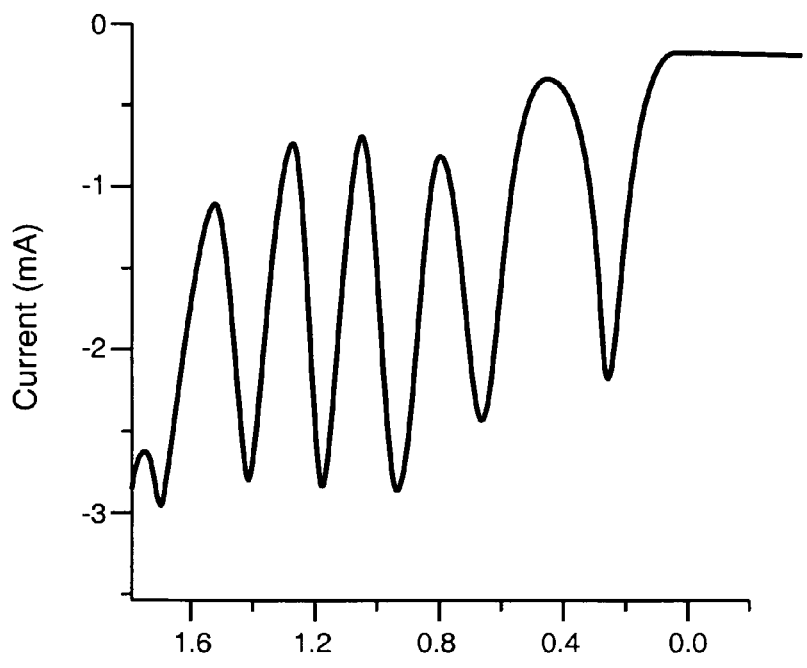
FIG._8

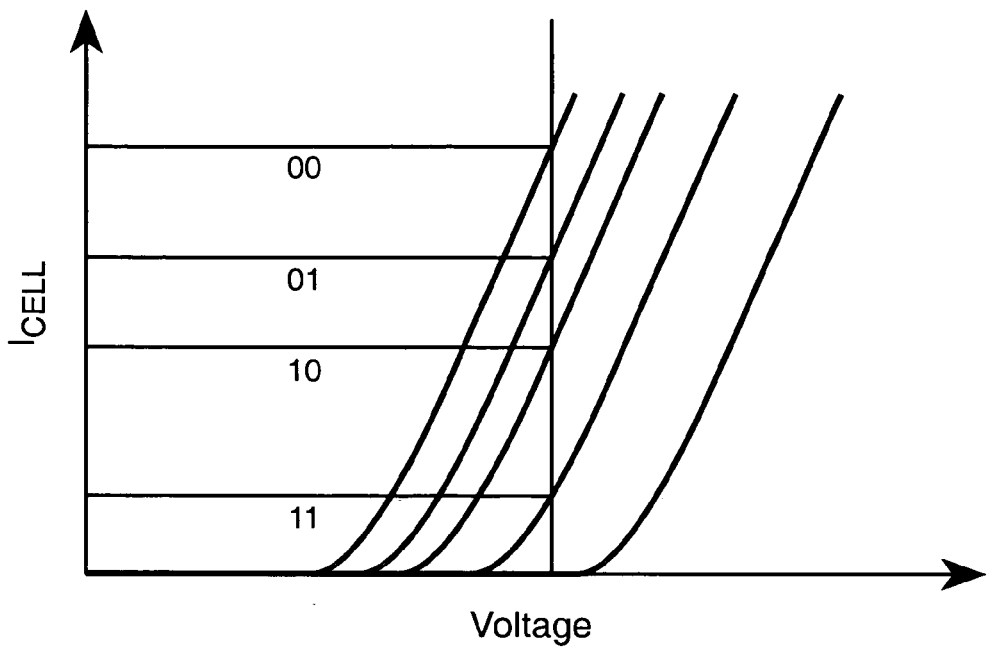
FIG._9
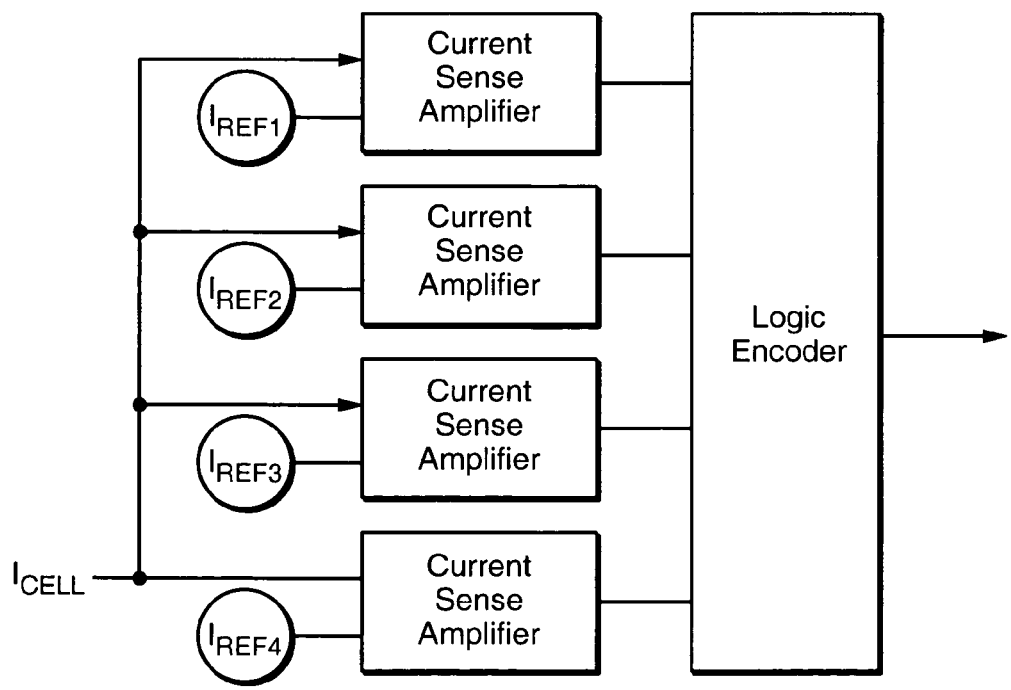
FIG._10

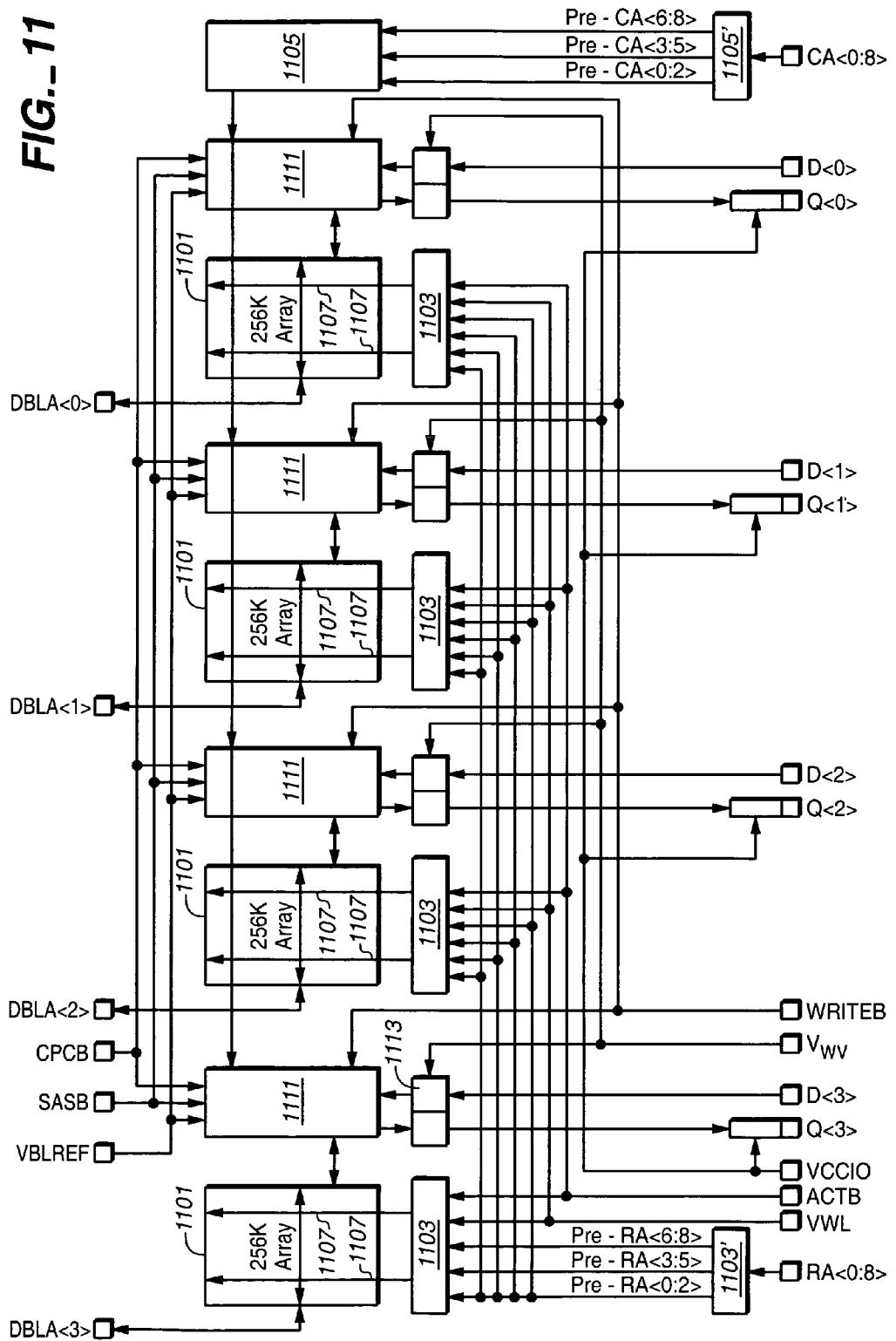
FIG._11

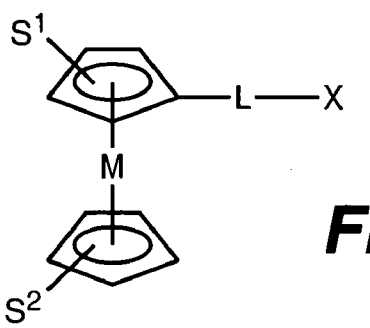
FIG._12A
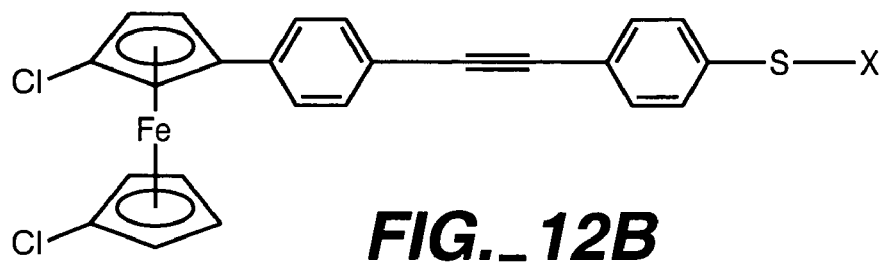
FIG._12B
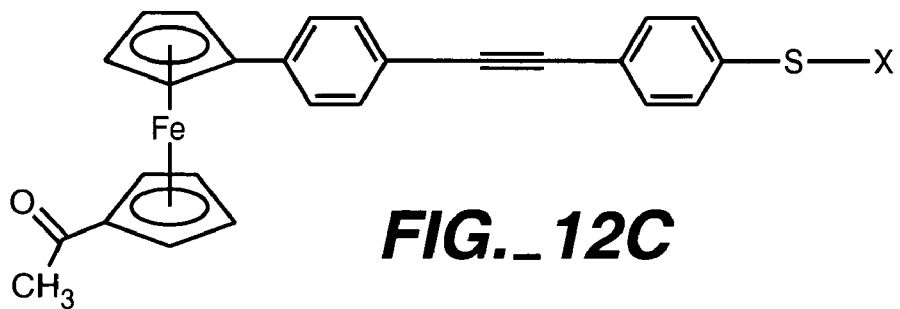
FIG._12C
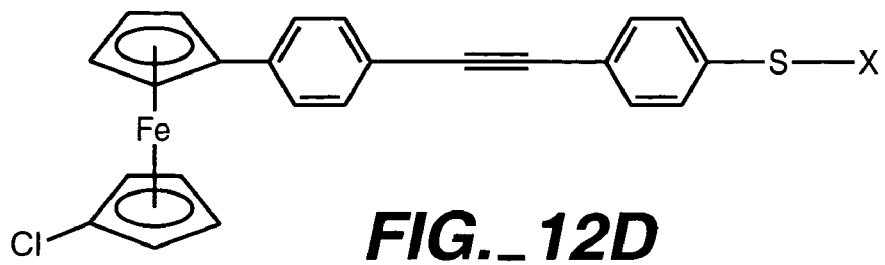
FIG._12D

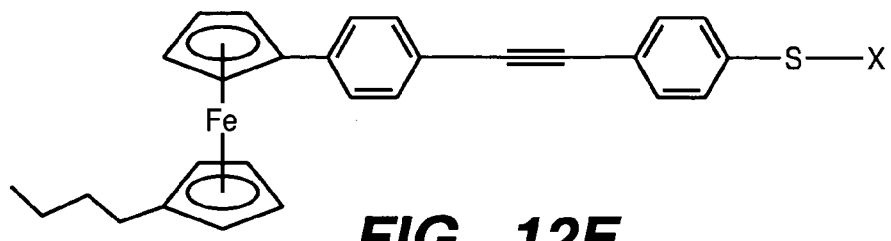
*FIG._12E*
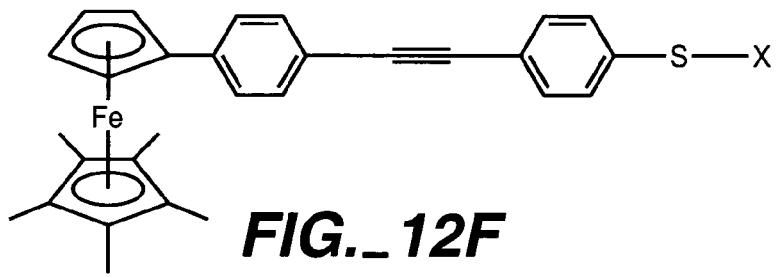
*FIG._12F*
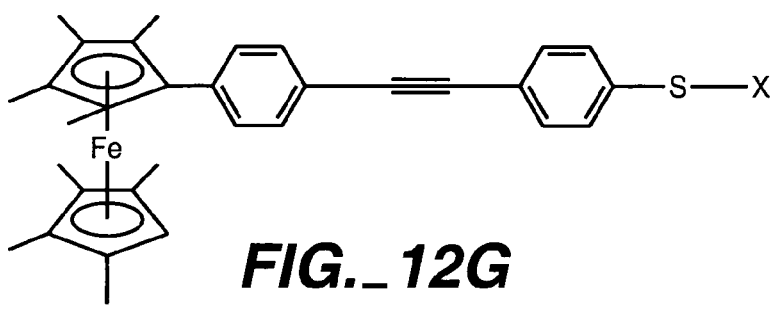
*FIG._12G*
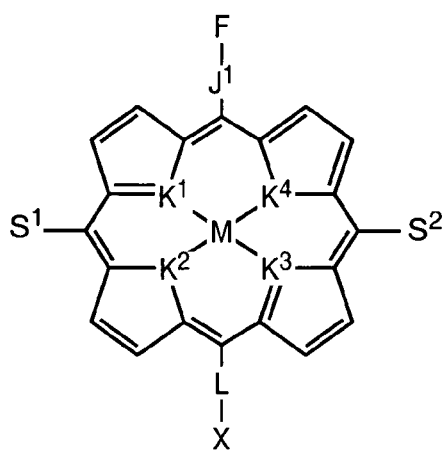
*FIG._12H*

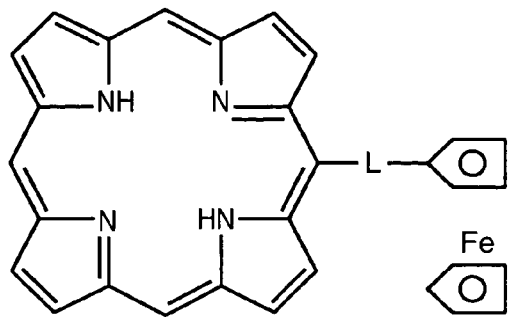
FIG._13A
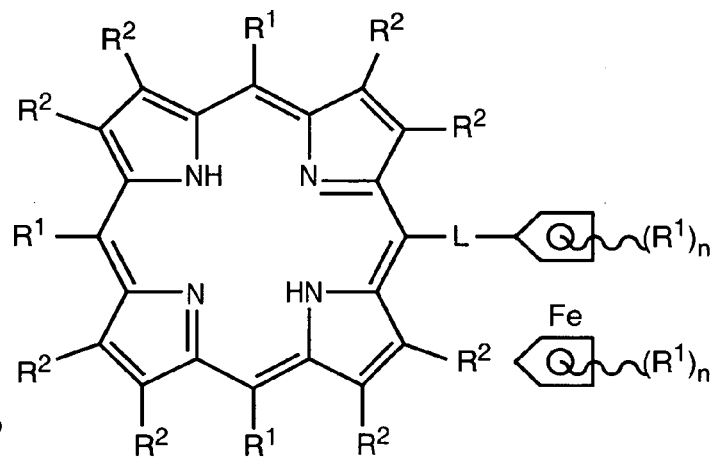
FIG._13B
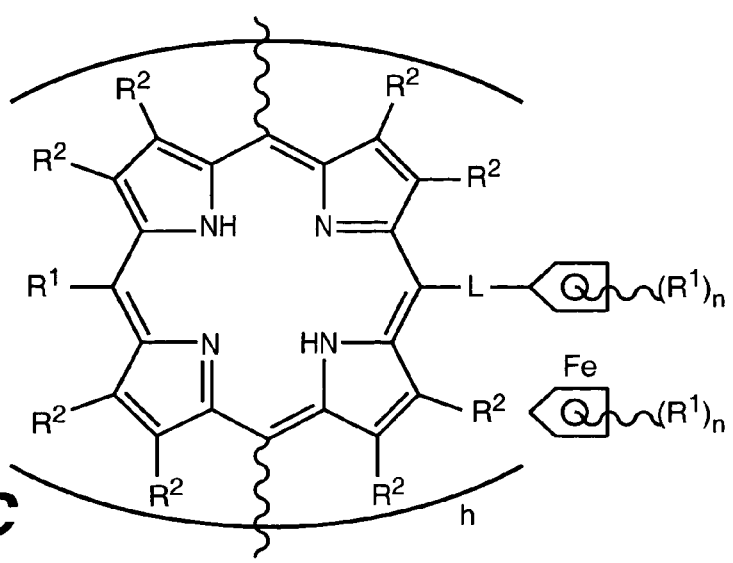
FIG._13C

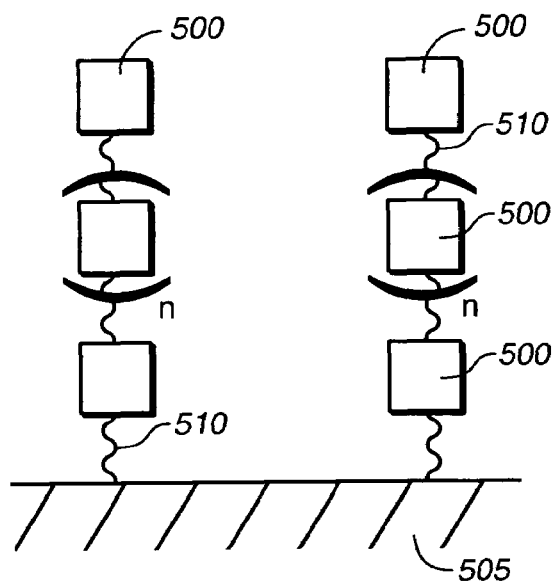
FIG._14A
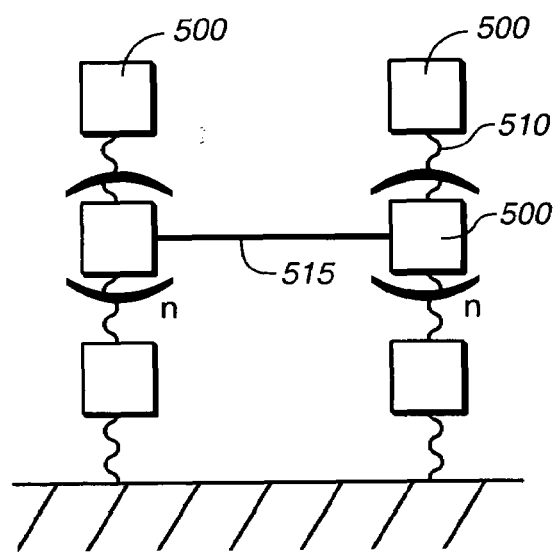
FIG._14B
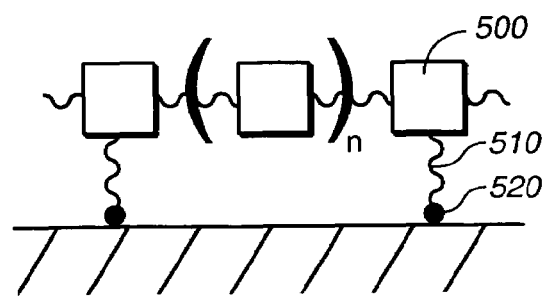
FIG._14C

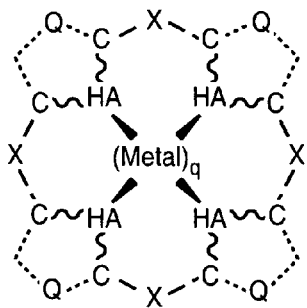
—X— independently selected from:
| | |
|---|---|
| $-CHR^1-$ | $-CRR-CR=$ |
| $=CR-$ | $=CR-CRR=$ |
| $-CR=$ | $=CR-CR=$ |
| $-N=$ | $-CR=CR-$ |
| $=N-$ | $-(CRR)_p-$ |
| $-NR-$ | |
C = Carbon
HA = Heteroatom
∿ = Single or Double Bond
····Q···· = Together with – C ∿ HA ∿ C – form independently selected 5 or 6 membered rings, optionally substituted with 1, 2, or 3 $R^2$ groups, such that the compound is electronically conjugated
q = 0 or 1
FIG._15

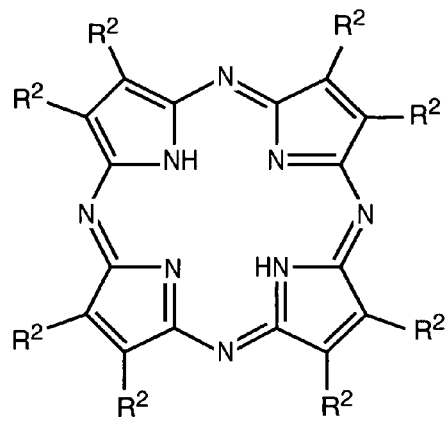
FIG._16A
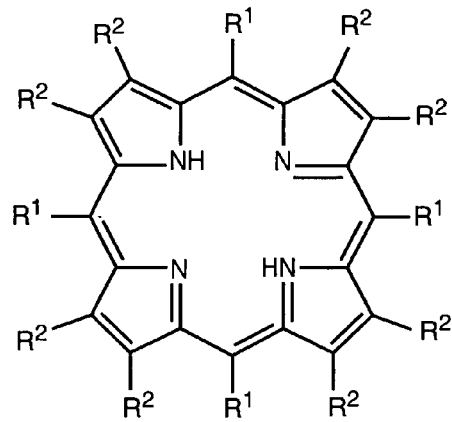
FIG._16B
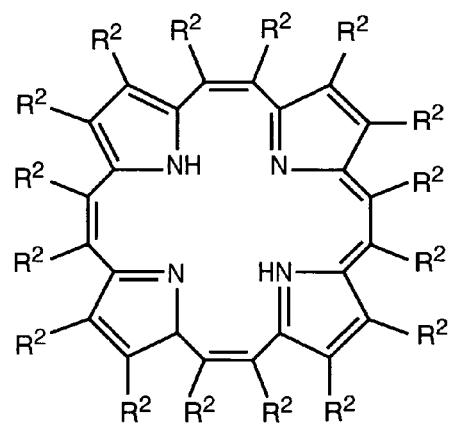
FIG._16C

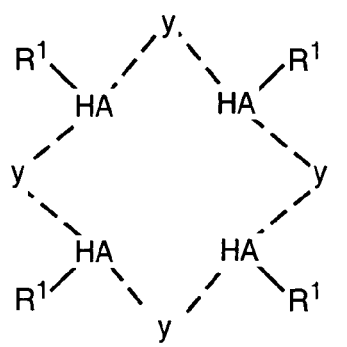
---y--- is independently selected from
- $-(CR_2)_2-$
- $-(CR_2)_3-$
- $-CR=CR-$
- $=CR-CR=$
- $=CR-CR_2-$
- $-CR_2-CR=$
- $-(CR_2)_3-$
- $=CR-CR_2-CR_2-$
- $-CR_2-CR_2-CR=$
- $=CR-CR=CR-$
- $-CR=CR-CR=$
- $-CR_2-NR-CR_2-$
- $=CR-NR-CR_2-$
- $=CR-NR-CR=$
- $-CR=N-CR_2-$
- $-CR=N-CR=$
- $-CR_2-N=CR_2-$
FIG._17A
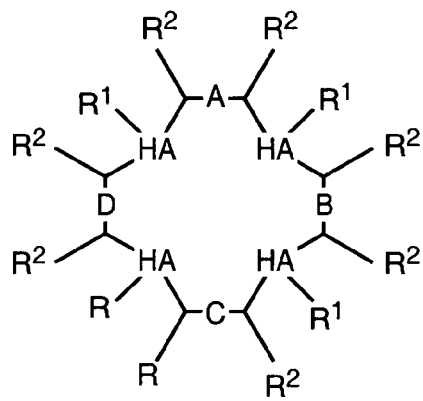
FIG._17B

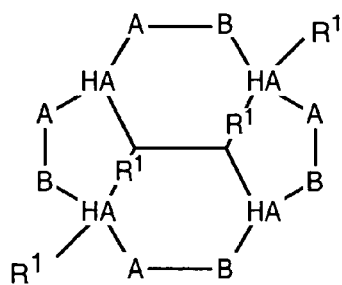
FIG._17C
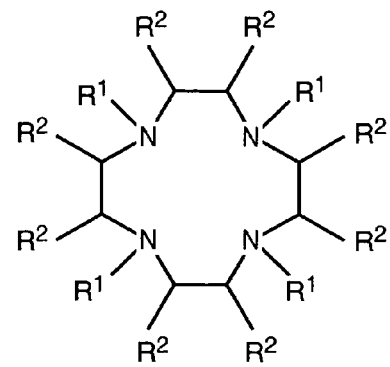
FIG._17D
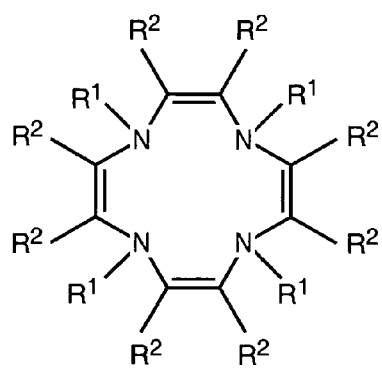
FIG._17E
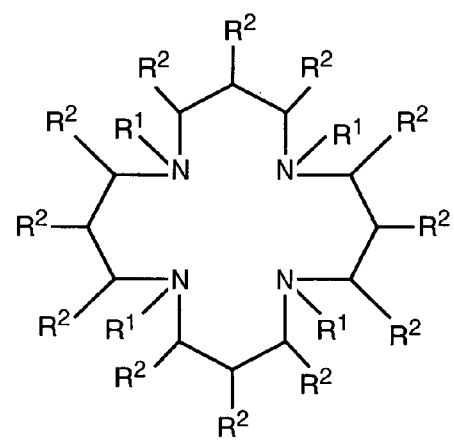
FIG._17F

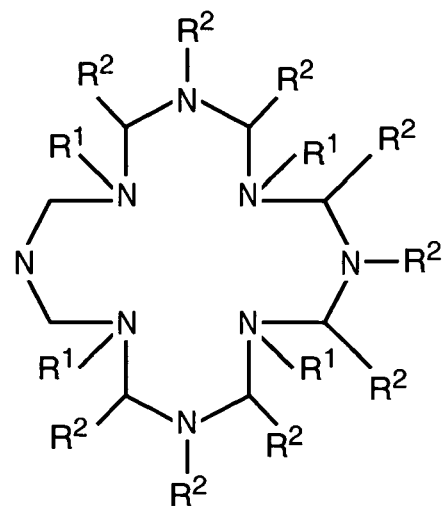
FIG._17G
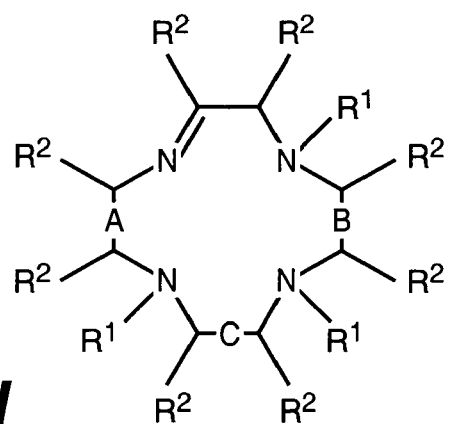
FIG._17H
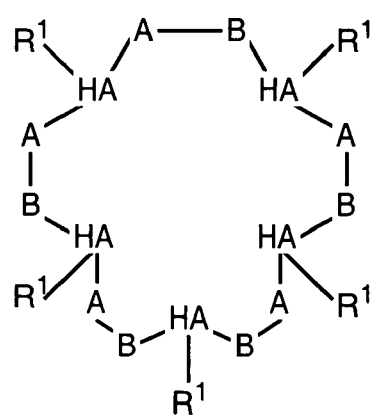
FIG._17I

MOLECULAR MEMORY DEVICES AND METHODS

This application is a continuation application of U.S. application Ser. No. 11/046,518, filed on Jan. 28, 2005 now abandoned, which is a Continuation-in-Part of U.S. application Ser. No. 10/766,304, filed on Jan. 28, 2004, now abandoned all which are hereby incorporated by reference in their entirety.

FIELD OF THE INVENTION

This invention relates to memory devices, such as static, permanent and dynamic random access memory. In particular, this invention relates to molecular memory cells, molecular memory arrays, and electronic devices including molecular memory, particularly logic devices.

BACKGROUND OF THE INVENTION

Advances in semiconductor processing and device design have resulted in computing devices being incorporated with a seemingly endless variety of tools and machines ranging from conventional programmable computers to communication equipment and entertainment devices. Irrespective of its end purpose, a computing device is generally made up of three main components, a central processing unit (CPU), random access memory (RAM), and an addressing and communication mechanism enabling data exchange between the CPU and the RAM. In a computing device, data is stored, communicated and manipulated in the form of signals (e.g., voltage, current, optical and the like). The CPU contains circuitry for logically manipulating the signals whereas the memory contains circuitry for storing the signals before, during and after the CPU's manipulation of those signals.

Conventional CPUs, memory devices and data communication mechanisms are mass produced as solid state electronic devices. Although sometimes referred to as "semiconductor devices", solid state electronic devices rely on electrical behavior of solids including metals, semiconductors, and insulators. The techniques and equipment for producing solid state devices have improved dramatically over time to enable the production of devices such as switches, capacitors, resistors, and interconnections with sub-micron scale features.

Performance of the memory components of a computing device is becoming an increasingly important determinant of overall system performance. Larger quantities of memory enable a greater variety of applications and functions to be implemented by the computing device and may reduce or eliminate the need for separate mass storage devices. Higher speed memory supports higher CPU processing frequencies, making the computing devices more useful for complex or real-time tasks. Denser memory devices support a growing variety of battery-powered electronic devices such as laptop computers, PDAs, multifunction cellular telephones, and the like. At the same time, many of these applications benefit from reduced power consumption.

In many cases improvements in semiconductor processing technology have had the effect of improving each of these important figures to make denser, larger, faster and more power efficient memory devices. In many cases, the solid state electronic behavior of the devices improves as the devices become smaller. Unfortunately, conventional silicon-based memory, such as DRAM memory, has reached a point where continued reduction in the size of conventional semiconductor memory cells is expected to adversely affect at least some of these important parameters.

One reason for the reduced speed and increased power consumption at smaller dimensions is that memory devices usually implement a capacitor for each stored bit of information. A capacitor is a charge storage device formed by conductive plates that are separated by an insulator. As capacitors become smaller the quantity of charge that can be stored is reduced. To serve as a reliable memory device, a capacitor must have sufficient capacity to hold a signal at a level that can be later reliable detected as data. Moreover, capacitors are inherently "leaky" devices in that some of the charge stored in a capacitor dissipates or leaks over time. Memory devices based on smaller capacitors are more sensitive to leakage problems because they simply have less charge that can be lost before the stored data becomes irretrievable.

To overcome the transient nature of capacitive storage, memory devices use refresh circuitry that frequently reads out a stored signal, amplifies it to a higher level, and stores it back into the capacitor. As a capacitors shrink, the rate at which the capacitor needs to be refreshed increases. In turn, higher capacitor refresh rates reduce the percentage of time that a memory cell is available for reading and writing data. Moreover, a greater percentage of the total power consumption of the memory device is then used to refresh the memory. Even when the device is in a dormant or inactive state, traditional DRAM requires continuous refreshing and therefore continuous power consumption. Accordingly, researchers are actively seeking new ways of storing data signals that overcome the problems associated with smaller capacitors in conventional capacitor based memory devices.

Memory cell designers have attempted to maintain low refresh rates in smaller memory cells by boosting the amount of capacitance that can be formed in a given amount of chip area. Boosting capacitance often involves increasing the surface area of the capacitor's charge holding material, which is very difficult to do when the overall size of the capacitor is shrinking. While designers have had some success at controlling surface area by forming the charge holding material into three-dimensional trench and stacked capacitor designs, it is unlikely that these techniques can be relied for continued progress rendering larger capacitances in smaller devices. The solid state electronic behaviors upon which device performance is predicated begin to break down as the dimensions of various device features become smaller such that a capacitor can no longer store sufficient charge for sufficient time to be useful in a memory device.

Another problem facing memory designers trying to increase information density (e.g., the amount of information that can be stored in a given area of the memory chip). Each memory cell of a conventional solid state capacitor can only store one bit of information. Accordingly, it would be desirable to have a memory device with improved information storage density achieved by having a memory cell that can reliably store a plurality of discrete states.

In view of the above, it is apparent that a need exists for memory devices, such as dynamic random access memory, that overcome limitations imposed by conventional solid state memory design. In particular, there is a need for molecular memory cells, molecular memory arrays, and electronic devices including molecular memory. Further, there is a need for molecular memory devices that can be manufactured using techniques that are compatible with existing semiconductor manufacturing practices so that semiconductor devices and interconnections can be manufactured monolithically with molecular memory devices.

SUMMARY OF THE INVENTION

Briefly stated, an embodiment of the present invention comprises a molecular memory element that includes a switching device, a bit line and a word line coupled to the switching device, and a molecular storage device accessible through the switching device. The molecular storage device is capable of being placed in two or more discrete states, wherein the molecular storage device is placed in one of the discrete states by signals applied to the bit and word line. The molecular storage device comprises a first electrode, a second electrode and a molecular material between the first and second electrode.

The present invention also relates to molecular memory arrays comprising a plurality of molecular storage elements where each molecular storage element is capable of being placed in two or more discrete states. A plurality of bit lines and word lines are coupled to the plurality of molecular storage elements such that each molecular storage element is coupled to and addressable by at least one bit line and at least one word line.

In another aspect, the present invention contemplates a molecular memory device comprising an addressable array of molecular storage elements. An address decoder receives a coded address and generates word line signals corresponding to the coded address. A word line driver is coupled to the address decoder and produces amplified word line signals. The amplified word line signals control switches that selectively couple members of the array of molecular storage elements to bit lines. Read/write logic coupled to the bit lines determines whether the molecular memory devices is in a read mode or a write mode. In a read mode, sense amplifiers coupled to each bit line detect an electronic state of the selectively coupled molecular storage elements and produce a data signal on the bit line indicative of the electronic state of the selectively coupled molecular storage elements. In a write mode, the read/write logic drives a data signal onto the bit lines and the selectively coupled molecular storage elements.

The present invention also contemplates devices including logic integrated with embedded molecular memory devices such as application specific integrated circuit (ASIC) and system on chip (SOC) devices and the like. Such implementations comprise one or more functional components formed monolithically with and interconnected to molecular memory devices. The functional components may comprise solid state electronic devices and/or molecular electronic devices.

In particular embodiments, the molecular storage device is implemented as a stacked structured formed subsequent to and above a semiconductor substrate having active devices formed therein. In other embodiments, the molecular storage device is implemented as a micron or nanometer sized hole in a semiconductor substrate have active devices formed therein. The molecular storage device is fabricated using processing techniques that are compatible with the semiconductor substrate and previously formed active devices in the semiconductor substrate. The molecular storage device comprises, for example, an electrochemical cell having two or more electrode surfaces separated by a an electrolyte (e.g., a ceramic or solid electrolyte). Storage molecules (e.g., molecules having one or more oxidation states that can be used for storing information) are coupled to an electrode surface within the electrochemical cells.

Additional aspects of the invention include the use of components independently selected from transistor switching devices including field effect transistor; a row decoder coupled to the word line; a column decoder coupled to the bit line; a current preamplifier connected to the bit line; a sense amplifier connected to the bit line, an address decoder that receives a coded address and generates word line signals corresponding to the coded address, a line driver coupled to the address decoder wherein the line driver produces amplified word line signals (optionally wherein the amplified word line signals control switches that selectively couple members of the array of molecular storage elements to bit lines), read/write logic coupled to the bit lines, wherein the read/write logic determines whether the molecular memory devices is in a read mode or a write mode, sense amplifiers coupled to each bit line, wherein when the device is in a read mode, sense amplifiers coupled to each bit line detect an electronic state of the selectively coupled molecular storage elements and produce a data signal on the bit line indicative of the electronic state of the selectively coupled molecular storage elements (such that when the device is in a write mode, the read/write logic drives a data signal onto the bit lines and the selectively coupled molecular storage elements) electrolyte layers; and combinations thereof.

Further aspects utilize the second electrode being coupled to ground, and the bit and word lines being either perpendicular or parallel.

Additional aspects have the memory arrays of the invention comprising volatile memory such as DRAM or SRAM, or non-volatile memory such as Flash or ferroelectric memory.

A further aspect provides arrays wherein the molecular storage device comprises an attachment layer formed on the first electrode, wherein the attachment layer comprises an opening and wherein the molecular material is in the opening and electronically coupled to the second electrode layer; and an electrolyte layer formed on the attachment layer.

An additional aspect provides ReAM selected from porphyrinic macrocycle, a metallocene, a linear polyene, a cyclic polyene, a heteroatom-substituted linear polyene, a heteroatom substituted cyclic polyene, a tetrathiafulvalene, a tetraselenafulvalene, a metal coordination complex, a buckyball, a triarylamine, a 1,4-phenylenediamine, a xanthene, a flavin, a phenazine, a phenothiazine, an acridine, a quinoline, a 2,2'=bipyridyl, a 4,4'-bipyridyl, a tetrathiotetracene or a peri-bridged naphthalene dichalcogenide.

A further aspect provides monolithically integrated device comprising logic devices configured to perform a particular function and embedded molecular memory devices of the invention coupled to the logic devices. The device may optionally comprise an application specific integrated circuit (ASIC), a system on chip (SOC), a solid state electronic devices or molecular electronic devices.

BRIEF DESCRIPTION OF THE DRAWINGS

FIG. 1 illustrates an exemplary memory device and memory array in accordance with an embodiment of the present invention in block diagram form;

FIG. 2 illustrates an exemplary system on a chip (SOC) with embedded molecular memory in accordance with the present invention;

FIG. 3 illustrates an exemplary molecular memory cell in accordance with an embodiment of the present invention;

FIG. 4 shows a timing diagram useful in operating a memory array in accordance with the present invention;

FIG. 7 and FIG. 8 are cyclic voltammograms that illustrate a current-voltage characteristic exemplary storage molecule implementations;

FIG. 9 illustrates a current-voltage characteristic of an exemplary molecular storage device in accordance with the present invention;

FIG. 10 schematically illustrates read/write circuitry useful in the present invention; and FIG. 11 shows a memory device and supporting interface and control logic in accordance with a particular implementation.

FIGS. 12A through 12H show, respectively the formula for a redox-active molecule as a metallocene in FIG. 12A, particular embodiments thereof in the form of ferrocenes in FIGS. 12B through 12G and a porphyrin in FIG. 12H.

FIGS. 13A, 13B and 13C depict various embodiments of the present invention. FIG. 13A depicts a ReAM comprising two redox active subunits, a porphyrin and a ferrocene. FIG. 13B is similar yet depicts the possible substituents. FIG. 13C depicts a polymer of the structure in 13B, wherein h is an integer of at least two.

FIGS. 14A, 14B and 14C schematically depict a variety of polymer configurations. FIG. 14C depicts Z-dimension linear polymers of independently selected ReAMs 500 with independently selected linkers 510 on the electrode 505. n is an integer of 0 or more, with from 1 to 8 being preferred, and the attachment moieties are not depicted. FIG. 14B depicts Z-dimension linear polymers as in 14A with crosslinking 515. As described below, branched Z-dimension polymers are also contemplated, with 1 or multiple branch points. FIG. 14C depicts X—Y dimension linear ReAM polymers with multiple attachment moieties 520; also contemplated are surfaces comprising different linear polymers of ReAMs, again, with either homopolymers or heteropolymers being useful. Branched ReAM polymers, with optional crosslinking, are also contemplated.

FIG. 15 depicts a broad macrocyclic ligand (e.g. the proligand (when q is 0) or the complex (when q is 1).

FIGS. 16A, 16B and 16C depict some embodiments of suitable ReAMs of the invention. These structures utilize nitrogen as the heteroatom coordination atom, although alternative heteroatoms (particularly oxygen and sulfur) can be used (although the valency of macrocycle may alter, as will be appreciated by those in the art). FIG. 16A is a phthalocyanine derivative, 13B is a porphyrin derivative, and 13C is an expanded porphyrin.

FIGS. 17A-17I depict macrocyclic proligands based on cyclen derivatives; the metal ions are not shown, and it will be appreciated that there may be additional hydrogen atoms not depicted as a result. The derivatives may be 12, 13, 14, 15 or 16 membered rings, depending the number of skeletal atoms in the —Y-structure, and the additional skeletal atoms may be carbon or a heteroatom. In FIG. 17B, a 12 membered ring, A, B, C and D can be independently selected from single and double bonds. In FIG. 17C, the cyclen has a "bridge" between two of the heteroatoms, with each A-B being independently selected from the group consisting of CR2 CR2, CR=CR, CR2 CR2 CR2, CR=CR CR2, CR2 CR=CR; CR2—NR—CR2—, —CR=N—CR2— and —CR2—N=CR—. FIGS. 17D-17G depict a variety of particular structures with available substituent positions. FIG. 17H depicts the "loss" of one of the "arms" of the cyclen derivative; as will be appreciated by the teachings here, a variety of additional cyclen based derivatives may also alter the valency of the bonds and remove R groups. FIG. 17I is a macrocyclic proligand with 5 donor heteroatoms. In some instances, larger rings are used and result in polynucleate complexes. Again, as described herein, any or all of these macrocyclic proligands and complexes, or mixtures thereof, as well as mixtures with other types of ReAMs, may be used as monomers in polymerization reactions.

DETAILED DESCRIPTION OF PREFERRED EMBODIMENTS

Figure 5:
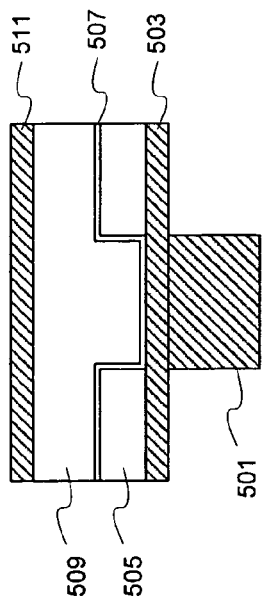
FIG. 5 shows a simplified cross-section of a stacked capacitor embodiment molecular storage device

The present invention contemplates a number of device and system architectures that enable the use of molecular memory elements (sometimes referred to herein and in related applications as "storage molecules" or "memory molecules") to be integrated with and benefit from the technology developed for conventional microelectronics. At one level the present invention involves molecular memory elements that integrate storage molecules with switching logic that enables reading and writing to the storage molecules. At another extreme, the represent invention contemplates highly integrated circuits having logic devices, including data processing circuitry, integrated monolithically with molecular memory arrays to provide new and useful functions that leverage one or more the unique features of molecular memory such as lower power usage, superior data persistence, higher information density, and the like.

There are a wide variety of suitable storage molecules for use in the present invention that are based on redox active moieties or redox active molecules. By "redox active moiety" or "redox active molecule" or "ReAM" herein is meant a moiety that is capable of being oxidized or reduced by the application of a suitable voltage. Suitable voltages in this context are those used in traditional microelectronics.

In some embodiments, the redox active moiety has at least two or more distinguishable non-neutral oxidation states, with at least 3, 4, 5, 6, 7, 8 or higher oxidation states being useful, particularly in storing multiple bits per molecule. In some embodiments, particularly when mixtures of different ReAMs are used at each storage location, the individual ReAMs may have only a single non-neutral oxidation state, but the collection of different moieties at each location provides the multiple oxidation states for the storage density. Furthermore, in the case of ReAM polymers, the use of heteropolymers of different monomers with fewer oxidation states can also result in a plurality of oxidation states.

Alternatively, in some embodiments, storage devices with high charge densities are useful, in which multiple charges (e.g. electrons) are read at the same voltage; for example, the oxidation of the storage molecule at a particular voltage may result in the loss of 2 or 3 electrons instead of one. Thus ReAMs can be designed to have fewer oxidation states but give up more electrons at each state, leading to higher charge density on the surface.

"Oxidation" refers to the loss of one or more electrons in an element, compound, or chemical substituent/subunit. In an oxidation reaction, electrons are lost by atoms of the element(s) involved in the reaction. The charge on these atoms must then become more positive. The electrons are lost from the species undergoing oxidation and so electrons appear as products in an oxidation reaction. An oxidation is taking place in the reaction $Fe^{3+}(aq) \rightarrow Fe^{3+}(aq)+e-$ because electrons are lost from the species being oxidized, $Fe^{3+}(aq)$, despite the apparent production of electrons as "free" entities in oxidation reactions. Conversely the term "reduction" refers to the gain of one or more electrons by an element, compound, or chemical substituent/subunit.

An "oxidation state" refers to the electrically neutral state or to the state produced by the gain or loss of electrons to a ReAM or redox active subunit. In a preferred embodiment, the term "oxidation state" refers to states including the neutral state and any state other than a neutral state caused by the gain or loss of electrons (reduction or oxidation).

In general, as described below, there are several types of ReAMs useful in the present invention, all based on polydentate proligands, including macrocyclic and non-macrocyclic moieties. A number of suitable proligands and complexes, as well as suitable substituents, are outlined in U.S. Pat. Nos. 6,212,093; 6,728,129; 6,451,942; 6,777,516; 6,381,169; 6,208,553; 6,657,884; 6,272,038; 6,484,394; and U.S. Ser. Nos. 10/040,059; 10/682,868; 10/445,977; 10/834,630; 10/135,220; 10/723,315; 10/456,321; 10/376,865; all of which are expressly incorporated by reference, in particular for the structures and descriptions thereof depicted therein.

Suitable proligands fall into two categories: ligands which use nitrogen, oxygen, sulfur, carbon or phosphorus atoms (depending on the metal ion) as the coordination atoms (generally referred to in the literature as sigma (σ) donors) and organometallic ligands such as metallocene ligands (generally referred to in the literature as pi (π) donors, and depicted herein as Lm).

In addition, a single ReAM may have two or more redox active subunits. For example, as shown in FIG. 13A, there are two redox active subunits, a porphyrin (shown in FIG. 13 in the absence of a metal) and a ferrocene (both of which can be optionally substituted with independently selected substituents at any position, as described below and depicted in FIG. 13B), usually, but optionally, attached via a linker, L. Similarly, sandwich coordination compounds are considered a single ReAM. This is to be distinguished from the case where these ReAMs are polymerized as monomers; for example, FIG. 13C depicts a polymerized version of FIG. 13B, wherein h is an integer of 2 or more. In addition, the metal ions/complexes of the invention may be associated with a counterion, not generally depicted herein.

Macrocyclic Ligands

In one embodiment, the ReAM is a macrocyclic ligand, which includes both macrocyclic proligands and macrocyclic complexes. By "macrocyclic proligand" herein is meant a cyclic compound which contain donor atoms (sometimes referred to herein as "coordination atoms") oriented so that they can bind to a metal ion and which are large enough to encircle the metal atom. In general, the donor atoms are heteroatoms including, but not limited to, nitrogen, oxygen and sulfur, with the former being especially preferred. However, as will be appreciated by those in the art, different metal ions bind preferentially to different heteroatoms, and thus the heteroatoms used can depend on the desired metal ion. In addition, in some embodiments, a single macrocycle can contain heteroatoms of different types.

A "macrocyclic complex" is a macrocyclic proligand with at least one metal ion; in some embodiments the macrocyclic complex comprises a single metal ion, although as described below, polynucleate complexes, including polynucleate macrocyclic complexes, are also contemplated.

A wide variety of macrocyclic ligands find use in the present invention, including those that are electronically conjugated and those that may not be; however, the macrocyclic ligands of the invention preferably have at least one, and preferably two or more oxidation states, with 4, 6 and 8 oxidation states being of particular significance.

A broad schematic of a suitable macrocyclic ligand is shown and described in FIG. 15. In this embodiment, roughly based on porphyrins, a 16 member member ring (when the —X-moiety contains a single atom, either carbon or a heteroatom), 17 membered rings (where one of the —X-moieties contains two skeletal atoms), 18 membered rings (where two of the —X-moieties contains two skeletal atoms), 19 membered rings (where three of the —X-moieties contains two skeletal atoms) or 20 membered rings (where all four of the —X-moieties contains two skeletal atoms), are all contemplated. Each —X-group is independently selected. The . . . Q . . . moiety, together with the skeletal—C-heteroatom-C (with either single or double bonds independently connecting the carbons and heteroatom) for 5 or 6 membered rings that are optionally substituted with 1 or 2 (in the case of 5 membered rings) or 1, 2, or 3 (in the case of 6 membered rings) with independently selected R2 groups. In some embodiments, the rings, bonds and substitutents are chosen to result in the compound being electronically conjugated, and at a minimum to have at least two oxidation states.

In some embodiments, the macrocyclic ligands of the invention are selected from the group consisting of porphyrins (particularly porphyrin derivatives as defined below), and cyclen derivatives.

Porphyrins

A particularly preferred subset of macrocycles suitable in the invention are porphyrins, including porphyrin derivatives. Such derivatives include porphyrins with extra rings ortho-fused, or ortho-perifused, to the porphyrin nucleus, porphyrins having a replacement of one or more carbon atoms of the porphyrin ring by an atom of another element (skeletal replacement), derivatives having a replacement of a nitrogen atom of the porphyrin ring by an atom of another element (skeletal replacement of nitrogen), derivatives having substituents other than hydrogen located at the peripheral (meso-, (3- or core atoms of the porphyrin, derivatives with saturation of one or more bonds of the porphyrin (hydroporphyrins, e.g., chlorins, bacteriochlorins, isobacteriochlorins, decahydroporphyrins, corphins, pyrrocorphins, etc.), derivatives having one or more atoms, including pyrrolic and pyrromethenyl units, inserted in the porphyrin ring (expanded porphyrins), derivatives having one or more groups removed from the porphyrin ring (contracted porphyrins, e.g., corrin, corrole) and combinations of the foregoing derivatives (e.g. phthalocyanines, sub-phthalocyanines, and porphyrin isomers). Additional suitable porphyrin derivatives include, but are not limited to the chlorophyll group, including etiophyllin, pyrroporphyrin, rhodoporphyrin, phylloporphyrin, phylloerythrin, chlorophyll a and b, as well as the hemoglobin group, including deuteroporphyrin, deuterohemin, hemin, hematin, protoporphyrin, mesohemin, hematoporphyrin mesoporphyrin, coproporphyrin, uruporphyrin and turacin, and the series of tetraarylazadipyrromethines.

As is true for the compounds outlined herein, and as will be appreciated by those in the art, each unsaturated position, whether carbon or heteroatom, can include one or more substitution groups as defined herein, depending on the desired valency of the system.

In one preferred embodiment, the redox-active molecule may be a metallocene as shown in the formula of FIG. 12A where L is a linker, M is a metal (e.g., Fe, Ru, Os, Co, Ni, Ti, Nb, Mn, Re, V, Cr, W), S¹ and SZ are substituents independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl. In preferred embodiments, a substituted aryl group is attached to the porphyrin, and the substituents on the aryl group are selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl.

Particularly preferred substituents include, but are not limited to, 4chlorophenyl, 3-acetamidophenyl, 2,4-dichloro-4-trifluoromethyl. Preferred substituents provide a redox potential range of less than about 2 volts. X is selected from the group consisting of a substrate, a reactive site that can covalently couple to a substrate (e.g. an alcohol, a thiol, etc.). It will be appreciated that in some embodiments, L-X may be an alcohol or a thiol. In certain instances L-X can be replaced with another substituent (S3) like S1 or S2. In certain embodiments, L-X can be present or absent, and when present preferably is 4-hydroxyphenyl, 4-(2-(4-hydroxyphenyl)ethynyl)phenyl, 4-hydroxymethyl)phenyl, 4-mercaptophenyl, 4-(2-(4-mercaptophenyl)ethynyl)phenyl, 4-(mercaptomethyl)phenyl, 4-hydroselenophenyl, 4-(2-(4-hydroselenophenyl)ethynyl)phenyl, 4-(hydroselenylmethyl)phenyl, 4-hydrotellurophenyl, 4-(2-(4-hydrotellurophenyl)ethynyl)phenyl, and 4-(hydrotelluromethyl)phenyl.

The oxidation state of molecules of the formula of FIG. 12A is determined by the metal and the substituents. Thus, particular preferred embodiments are illustrated by the formulae of FIGS. 12B-12G.

The ferrocenes listed above in the formulae of these figures provide a convenient series of one-bit molecules having different and distinguishable oxidation states. Thus the molecules of these formulae have oxidation states (Eli2) of +0.55 V, +0.48V, +0.39 V, +0.17 V, −0.05 V, and −0.18 V, respectively, and provide a convenient series of molecules for incorporation into a storage medium of this invention. It will be appreciated that the oxidation potentials of the members of the series can be routinely altered by changing the metal (M) or the substituents.

Another preferred redox-active molecule is a porphyrin illustrated by the formula of FIG. 12H where, F is a redox-active subunit (e.g., a ferrocene, a substituted ferrocene, a metalloporphyrin, or a metallochlorin, etc.), JI is a linker, M is a metal (e.g., Zn, Mg, Cd, Hg, Cu, Ag, Au, Ni, Pd, Pt, Co, Rh, Ir, Mn, B, Al, Ga, Pb, and Sn), S1 and S2 are independently selected from the group consisting of aryl, phenyl, cycloalkyl, alkyl, halogen, alkoxy, alkylthio, perfluoroalkyl, perfluoroaryl, pyridyl, cyano, thiocyanato, nitro, amino, alkylamino, acyl, sulfoxyl, sulfonyl, imido, amido, and carbamoyl wherein said substituents provide a redox potential range of less than about 2 volts, KI, KZ, K3, and K4 are independently selected from the group consisting of N, O, S, Se, Te, and CH; L is a linker; X is selected from the group consisting of a substrate, a reactive site that can covalently couple to a substrate, and a reactive site that can ionically couple to a substrate. In preferred embodiments, X or L-X may be an alcohol or a thiol. In some embodiments L-X can be eliminated and replaced with a substituent independently selected from the same group as S1 or S2.

Control over the hole-storage and hole-hopping properties of the redox-active units of the redox-active molecules used in the memory devices of the present invention allows fine control over the architecture of the memory device.

Such control is exercised through synthetic design. The hole-storage properties depend on the oxidation potential of the redox-active units or subunits that are themselves or that are used to assemble the storage media used in the devices of this invention. The hole-storage properties and redox potential can be tuned with precision by choice of base molecule(s), associated metals and peripheral substituents (Yang et al. (1999) J. Porphyrins Phthalocyanines, 3: 117-147), the disclosure of which is herein incorporated by this reference.

For example, in the case of porphyrins, Mg porphyrins are more easily oxidized than Zn porphyrins, and electron withdrawing or electron releasing aryl groups can modulate the oxidation properties in predictable ways. Hole-hopping occurs among isoenergetic porphyrins in a nanostructure and is mediated via the covalent linker joining the porphyrins (Seth et al. (1994) J. Am. Chem. Soc., 116: 10578-10592, Seth et al (1996) J. Am. Chem. Soc., 118: 11194-11207, Strachan et al. (1997) J. Am. Chem. Soc., 119: 11191-11201; Li et al. (1997) J. Mater. Chem., 7: 1245-1262, Strachan et al. (1998) Inorg. Chem., 37: 1191-1201, Yang et al. (1999) J. Am. Chem. Soc., 121: 4008-4018), the disclosures of which are herein specifically incorporated by this reference in their entirety.

The design of compounds with predicted redox potentials is well known to those of ordinary skill in the art. In general, the oxidation potentials of redox-active units or subunits are well known to those of skill in the art and can be looked up (see, e.g., Handbook of Electrochemistry of the Elements). Moreover, in general, the effects of various substituents on the redox potentials of a molecule are generally additive. Thus, a theoretical oxidation potential can be readily predicted for any potential data storage molecule. The actual oxidation potential, particularly the oxidation potential of the information storage molecule(s) or the information storage medium can be measured according to standard methods. Typically the oxidation potential is predicted by comparison of the experimentally determined oxidation potential of a base molecule and that of a base molecule bearing one substituent in order to determine the shift in potential due to that particular substituent. The sum of such substituent-dependent potential shifts for the respective substituents then gives the predicted oxidation potential.

The suitability of particular redox-active molecules for use in the methods of this invention can readily be determined. The molecule(s) of interest are simply polymerized and coupled to a surface (e.g., a hydrogen passivated surface) according to the methods of this invention. Then sinusoidal voltammetry can be performed (e.g., as described herein or in U.S. Pat. Nos. 6,272,038; 6,212,093; and 6,208,553, PCT Publication WO 01/03126, or by (Roth et al. (2000) *Vac. Sci. Technol. B* 18:2359-2364; Roth et al. (2003) *J. Am. Chem. Soc.* 125:505-517) to evaluate 1) whether or not the molecule(s) coupled to the surface, 2) the degree of coverage (coupling); 3) whether or not the molecule(s) are degraded during the coupling procedure, and 4) the stability of the molecule(s) to multiple read/write operations.

In addition, included within the definition of "porphyrin" are porphyrin complexes, which comprise the porphyrin proligand and at least one metal ion. Suitable metals for the porphyrin compounds will depend on the heteroatoms used as coordination atoms, but in general are selected from transition metal ions. The term "transition metals" as used herein typically refers to the 38 elements in groups 3 through 12 of the periodic table. Typically transition metals are characterized by the fact that their valence electrons, or the electrons they use to combine with other elements, are present in more than one shell and consequently often exhibit several common oxidation states. In certain embodiments, the transition metals of this invention include, but are not limited to one or more of scandium, titanium, vanadium, chromium, manganese, iron, cobalt, nickel, copper, zinc, yttrium, zirconium, niobium, molybdenum, technetium, ruthenium, rhodium, palladium, silver, cadmium, hafnium, tantalum, tungsten, rhenium, osmium, iridium, platinum, gold, mercury, rutherfordium, and/or oxides, and/or nitrides, and/or alloys, and/or mixtures thereof.

Other Macrocycles

There are also a number of macrocycles based on cyclen derivatives. FIG. 17 depicts a number of macrocyclic pro-ligands loosely based on cyclen/cyclam derivatives, which can include skeletal expansion by the inclusion of independently selected carbons or heteroatoms. In some embodiments, at least one R group is a redox active subunit, preferably electronically conjugated to the metal. In some embodiments, including when at least one R group is a redox active subunit, two or more neighboring R2 groups form cyclo or an aryl group.

Furthermore, in some embodiments, macrocyclic complexes relying organometallic ligands are used. In addition to purely organic compounds for use as redox moieties, and various transition metal coordination complexes with δ-bonded organic ligand with donor atoms as heterocyclic or exocyclic substituents, there is available a wide variety of transition metal organometallic compounds with π-bonded organic ligands (see Advanced Inorganic Chemistry, 5th Ed., Cotton & Wilkinson, John Wiley & Sons, 1988, chapter 26; Organometallics, A Concise Introduction, Elschenbroich et al., 2nd Ed., 1992, VCH; and Comprehensive Organometallic Chemistry II, A Review of the Literature 1982-1994, Abel et al. Ed., Vol. 7, chapters 7, 8, 10 & 11, Pergamon Press, hereby expressly incorporated by reference). Such organometallic ligands include cyclic aromatic compounds such as the cyclopentadienide ion [C5H5(−1)] and various ring substituted and ring fused derivatives, such as the indenylide (−1) ion, that yield a class of bis(cyclopentadieyl) metal compounds, (i.e. the metallocenes); see for example Robins et al., J. Am. Chem. Soc. 104:1882-1893 (1982); and Gassman et al., J. Am. Chem. Soc. 108:4228-4229 (1986), incorporated by reference. Of these, ferrocene [(C5H5)2Fe] and its derivatives are prototypical examples which have been used in a wide variety of chemical (Connelly et al., Chem. Rev. 96:877-910 (1996), incorporated by reference) and electrochemical (Geiger et al., Advances in Organometallic Chemistry 23:1-93; and Geiger et al., Advances in Organometallic Chemistry 24:87, incorporated by reference) electron transfer or "redox" reactions. Metallocene derivatives of a variety of the first, second and third row transition metals are useful as redox moieties (and redox subunits). Other potentially suitable organometallic ligands include cyclic arenes such as benzene, to yield bis(arene) metal compounds and their ring substituted and ring fused derivatives, of which bis(benzene)chromium is a prototypical example, Other acyclic π-bonded ligands such as the allyl (−1) ion, or butadiene yield potentially suitable organometallic compounds, and all such ligands, in conjuction with other π-bonded and δ-bonded ligands constitute the general class of organometallic compounds in which there is a metal to carbon bond. Electrochemical studies of various dimers and oligomers of such compounds with bridging organic ligands, and additional non-bridging ligands, as well as with and without metal-metal bonds are all useful.

When one or more of the co-ligands is an organometallic ligand, the ligand is generally attached via one of the carbon atoms of the organometallic ligand, although attachment may be via other atoms for heterocyclic ligands. Preferred organometallic ligands include metallocene ligands, including substituted derivatives and the metalloceneophanes (see page 1174 of Cotton and Wilkenson, supra). For example, derivatives of metallocene ligands such as methylcyclopentadienyl, with multiple methyl groups being preferred, such as pentamethylcyclopentadienyl, can be used to increase the stability of the metallocene. In some embodiments, the metallocene is derivatized with one or more substituents as outlined herein, particularly to alter the redox potential of the subunit or moiety.

As described herein, any combination of ligands may be used. Preferred combinations include: a) all ligands are nitrogen donating ligands; b) all ligands are organometallic ligands.

Sandwich Coordination Complexes

In some embodiments, the ReAMs are sandwich coordination complexes. The terms "sandwich coordination compound" or "sandwich coordination complex" refer to a compound of the formula L-$M_n$-L, where each L is a heterocyclic ligand (as described below), each M is a metal, n is 2 or more, most preferably 2 or 3, and each metal is positioned between a pair of ligands and bonded to one or more hetero atom (and typically a plurality of hetero atoms, e.g., 2, 3, 4, 5) in each ligand (depending upon the oxidation state of the metal). Thus sandwich coordination compounds are not organometallic compounds such as ferrocene, in which the metal is bonded to carbon atoms. The ligands in the sandwich coordination compound are generally arranged in a stacked orientation (i.e., are generally cofacially oriented and axially aligned with one another, although they may or may not be rotated about that axis with respect to one another) (see, e.g., Ng and Jiang (1997) Chemical Society Reviews 26: 433-442) incorporated by reference. Sandwich coordination complexes include, but are not limited to "double-decker sandwich coordination compound" and "triple-decker sandwich coordination compounds". The synthesis and use of sandwich coordination compounds is described in detail in U.S. Pat. Nos. 6,212,093; 6,451,942; 6,777,516; and polymerization of these molecules is described in U.S. Ser. No. 10/800,147, entitled Procedure for Preparing Redox-Active Polymers on Surfaces, Bocian, Liu and Lindsay, assigned to the Regents of the University of California, all of which are included herein, particularly the individual substitutent groups that find use in both sandwich complexes and the "single" "macrocycle" complexes.

The term "double-decker sandwich coordination compound" refers to a sandwich coordination compound as described above where n is 2, thus having the formula L'-M'-LZ, wherein each of L1 and LZ may be the same or different (see, e.g., Jiang et al. (1999) J. Porphyrins Phthalocyanines 3: 322-328) and U.S. Pat. Nos. 6,212,093; 6,451,942; 6,777,516; and polymerization of these molecules is described in U.S. Ser. No. 10/800,147, entitled Procedure for Preparing Redox-Active Polymers on Surfaces, Bocian, Liu and Lindsay, assigned to the Regents of the University of California hereby incorporated by reference in its entirety.

The term "triple-decker sandwich coordination compound" refers to a sandwich coordination compound as described above where n is 3, thus having the formula L'-M' LZ-MZ-L3, wherein each of L1, LZ and L3 may be the same or different, and M1 and MZ may be the same or different (see, e.g., Arnold et al. (1999) Chemistry Letters 483-484), and U.S. Pat. Nos. 6,212,093; 6,451,942; 6,777,516; and polymerization of these molecules is described in U.S. Ser. No. 10/800,147, entitled Procedure for Preparing Redox-Active Polymers on Surfaces, Bocian, Liu and Lindsay, assigned to the Regents of the University of California, hereby incorporated by reference in their entirety.

In addition, polymers of these sandwich compounds are also of use; this includes "dyads" and "triads" as described in U.S. Pat. Nos. 6,212,093; 6,451,942; 6,777,516; and polymerization of these molecules is described in U.S. Ser. No. 10/800,147, entitled Procedure for Preparing Redox-Active Polymers on Surfaces, Bocian, Liu and Lindsay, assigned to the Regents of the University of California, as well as polymers as described in U.S. Ser. No. 10/800,147 and herein.

Non-Macrocyclic Proligands and Complexes

As a general rule, ReAMs comprising non-macrocyclic chelators are bound to metal ions to form non-macrocyclic chelate compounds, since the presence of the metal allows for multiple proligands to bind together to give multiple oxidation states.

In some embodiments, nitrogen donating proligands are used. Suitable nitrogen donating proligands are well known in the art and include, but are not limited to, NH2; NHR; NRR'; pyridine; pyrazine; isonicotinamide; imidazole; bipyridine and substituted derivatives of bipyridine; terpyridine and substituted derivatives; phenanthrolines, particularly 1,10-phenanthroline (abbreviated phen) and substituted derivatives of phenanthrolines such as 4,7-dimethylphenanthroline and dipyridol[3,2-a:2', 3'-c]phenazine (abbreviated dppz); dipyridophenazine; 1,4,5,8,9,12-hexaazatriphenylene (abbreviated hat); 9,10-phenanthrenequinone diimine (abbreviated phi); 1,4,5,8-tetraazaphenanthrene (abbreviated tap); 1,4,8,11-tetra-azacyclotetradecane (abbreviated cyclam) and isocyanide. Substituted derivatives, including fused derivatives, may also be used. It should be noted that macrocylic ligands that do not coordinatively saturate the metal ion, and which require the addition of another proligand, are considered non-macrocyclic for this purpose. As will be appreciated by those in the art, it is possible to covalent attach a number of "non-macrocyclic" ligands to form a coordinatively saturated compound, but that is lacking a cyclic skeleton.

Suitable sigma donating ligands using carbon, oxygen, sulfur and phosphorus are known in the art. For example, suitable sigma carbon donors are found in Cotton and Wilkenson, Advanced Organic Chemistry, 5th Edition, John Wiley & Sons, 1988, hereby incorporated by reference; see page 38, for example. Similarly, suitable oxygen ligands include crown ethers, water and others known in the art. Phosphines and substituted phosphines are also suitable; see page 38 of Cotton and Wilkenson.

The oxygen, sulfur, phosphorus and nitrogen-donating ligands are attached in such a manner as to allow the heteroatoms to serve as coordination atoms.

Polynucleating Proligands and Complexes

In addition, some embodiments utilize polydentate ligands that are polynucleating ligands, e.g. they are capable of binding more than one metal ion. These may be macrocyclic or non-macrocyclic.

A number of suitable proligands and complexes, as well as suitable substituents, are outlined in U.S. Pat. Nos. 6,212,093; 6,728,129; 6,451,942; 6,777,516; 6,381,169; 6,208,553; 6,657,884; 6,272,038; 6,484,394; and U.S. Ser. Nos. 10/040,059; 10/682,868; 10/445,977; 10/834,630; 10/135,220; 10/723,315; 10/456,321; 10/376,865; all of which are expressly incorporated by reference, in particular for the structures and descriptions thereof depicted therein.

Polymers

The memory elements of the invention may also comprise polymers of the ReAMs as outlined above; for example, porphyrin polymers (including polymers of porphyrin complexes), macrocycle complex polymers, ReAMs comprising two redox active subunits, etc. can be utilized. The polymers can be homopolymers or heteropolymers, and can include any number of different mixtures (admixtures) of monomeric ReAMs, wherein "monomer" can also include ReAMs comprising two or more subunits (e.g. a sandwich coordination compound, a porphyrin derivative substituted with one or more ferrocenes, etc.). ReAM polymers are described in U.S. Ser. No. 10/800,147, U.S. Ser. No. 10/800, 147 entitled Procedure for Preparing Redox-Active Polymers on Surfaces, Bocian, Liu and Lindsay, assigned to the Regents of the University of California, which is expressly incorporated by reference in its entirety.

The configuration of the polymers on the electrode can vary. In some embodiments, the polymers are linear in the Z dimension (the direction perpendicular to the substrate surface, as is depicted in FIG. 14A), and can be optionally crosslinked (FIG. 14B). Branched polymers in the Z dimension are also contemplated, and can be optionally crosslinked as well. Linear polymers in the X—Y-dimension (FIG. 14C), or branched and/or crosslinked polymers are also included. In addition, mixtures of polymers can be used in any of these configurations.

In some embodiments, configurations (including selection of linkers) that control orientation and spacing of the ReAMs, whether polymeric or monomeric, are preferred, as generally higher densities of the ReAMs can be achieved, as well as better electron transfer and electron transfer rates. Linker length can contribute to the rate and retention of charge In general, the polymerization embodiments rely on the use of substitutents that will result in both attachment to the electrode surface as well as polymerization to additional ReAMs. As described in U.S. Ser. No. 10/800,147, entitled Procedure for Preparing Redox-Active Polymers on Surfaces, Bocian, Liu and Lindsay, assigned to the Regents of the University of California, there are two general methods for the synthesis of these ReAMs: "in situ" polymerization on the surface, and prepolymerization followed by addition to the surface using one or more attachment moieties, described in detail in U.S. Ser. No. 10/800,147, entitled Procedure for Preparing Redox-Active Polymers on Surfaces, Bocian, Liu and Lindsay, assigned to the Regents of the University of California, expressly incorporated by reference in its entirety, and with particular respect herein as to the "one-step" and "two-step" polymerization/attachment steps.

Substitutents

Many of the compounds described herein utilize substituents, generally depicted herein as "R". Suitable R groups include, but are not limited to, hydrogen, alkyl, alcohol, aryl, amino, amido, nitro, ethers, esters, aldehydes, sulfonyl, silicon moieties, halogens, cyano, acyl, sulfur containing moieties, phosphorus containing moieties, amido, imido, carbamoyl, linkers, attachment moieties and other ReAMs (e.g. subunits). It should be noted that some positions may allow two substitution groups, R and R', in which case the R and R' groups may be either the same or different, and it is generally preferred that one of the substitution groups be hydrogen.

In some embodiments, the R groups are as defined and depicted in the figures and the text from U.S A number of suitable proligands and complexes, as well as suitable substituents, are outlined in U.S. Pat. Nos. 6,212,093; 6,728, 129; 6,451,942; 6,777,516; 6,381,169; 6,208,553; 6,657, 884; 6,272,038; 6,484,394; and U.S. Ser. Nos. 10/040,059; 10/682,868; 10/445,977; 10/834,630; 10/135,220; 10/723, 315; 10/456,321; 10/376,865; all of which are expressly incorporated by reference, in particular for the structures and descriptions thereof depicted therein, hereby expressly incorporated as substitutent embodiments, both for the particular macrocycle the substituents are depicted within and for further substituted derivatives.

By "alkyl group" or grammatical equivalents herein is meant a straight or branched chain alkyl group, with straight chain alkyl groups being preferred. If branched, it may be branched at one or more positions, and unless specified, at any position. The alkyl group may range from about 1 to about 30 carbon atoms (C1 C30), with a preferred embodiment utilizing from about 1 to about 20 carbon atoms (C1 C20), with about C1 through about C12 to about C15 being preferred, and C1 to C5 being particularly preferred. Also included within the definition of an alkyl group are cycloalkyl groups such as C5 and C6 rings, and heterocyclic rings with nitrogen, oxygen, sulfur or phosphorus. Alkyl also includes heteroalkyl, with heteroatoms of sulfur, oxygen, nitrogen, and silicone being preferred.

By "aryl group" or grammatical equivalents herein is meant aromatic aryl rings including mono- and multil-ring systems, and heterocyclic aromatic rings and ring systems such as pyridine, furan, thiophene, pyrrole, indole and purine.

Included within the definition of "alkyl" and "aryl" are substituted alkyl and aryl groups. That is, the alkyl and aryl groups may be substituted, with one or more "R" substitution groups as defined herein. For example, a phenyl group may be a substituted phenyl group substituted with one or more R groups. Preferred alkyl groups alkylthio, perfluoroalkyl, alkylamino, and alkoxy.

By "amino groups" or grammatical equivalents herein is meant —NH2, —NHR and —NR2 groups, with R being as defined herein.

By "nitro group" herein is meant an —NO2 group.

By "sulfur containing moieties" herein is meant compounds containing sulfur atoms, including but not limited to, thia-, thio- and sulfo-compounds, thiols (—SH and —SR), and sulfides (—RSR—), including sulfoxyl and sulfonyl. By "phosphorus containing moieties" herein is meant compounds containing phosphorus, including, but not limited to, phosphines and phosphates. By "silicon containing moieties" herein is meant compounds containing silicon.

By "ether" herein is meant an —O—R group. Preferred ethers include alkoxy groups, with —O— (CH2)2CH3 and —O—(CH2)4CH3 being preferred.

By "ester" herein is meant a —COOR group.

By "halogen" herein is meant bromine, iodine, chlorine, or fluorine. Preferred substituted alkyls are partially or fully halogenated alkyls such as CF3, etc.

By "aldehyde" herein is meant —RCOH groups.

By "alcohol" herein is meant —OH groups, and alkyl alcohols —ROH.

By "amido" herein is meant —RCONH— or RCONR— groups.

By "ethylene glycol" herein is meant a —(O—CH2—CH2)n-group, although each carbon atom of the ethylene group may also be singly or doubly substituted, i.e. —(O—CR2—CR2)n-, with R as described above. Ethylene glycol derivatives with other heteroatoms in place of oxygen (i.e. —(N—CH2—CH2)n- or —(S—CH2—CH2)n-, or with substitution groups) are also preferred.

Attachment Moieties

As depicted herein, attachment moieties (depicted herein as "Z") are used to attach the ReAMs of the invention to the electrodes. "Molecules bearing an attachment group" include molecules wherein the attachment group is an intrinsic component of the molecule, molecules derivatized to add an attachment group, and molecules derivatized so they bear a linker comprising an attachment group.

The nature of the attachment moiety depends on the composition of the electrode substrate. In general, attachment moieties, together with the linkers, if present, allow the electronic coupling of the storage molecule to the electrode. "Electronic coupling" in this context refers to an association between the storage molecule and the electrode such that electrons move from the storage medium/molecule to the electrode or from the electrode to the storage medium/molecule and thereby alter the oxidation state of the storage medium/molecule. Electrical coupling can include direct covalent linkage between the storage medium/molecule and the electrode, indirect covalent coupling (e.g., via a linker), direct or indirect ionic bonding between the storage medium/molecule and the electrode, or other bonding (e.g., hydrophobic bonding). In addition, no actual bonding may be required and the storage medium/molecule may simply be contacted with the electrode surface. There also need not necessarily be any contact between the electrode and the storage medium/molecule where the electrode is sufficiently close to the storage medium/molecule to permit electron tunneling between the medium/molecule and the electrode.

Generally, suitable attachment moieties include, but are not limited to, carboxylic acids, alcohols, thiols (including S-acetylthiols) selenol, tellurol, phosphonic acids, phosphonothioate, amines, nitrile, aryl and alkyl groups, including substituted aryl and alkyl groups such as iodoaryls and bromomethyls. U.S. Ser. No. 10/800,147, entitled Procedure for Preparing Redox-Active Polymers on Surfaces, Bocian, Liu and Lindsay, assigned to the Regents of the University of California, incorporated by reference herein for this purpose, provides an extensive list of suitable attachment moieties and linkers (both independently and as "L-Z" groups); see paragraphs 107 to 113). It should be noted that the attachment moieties can result in a ReAM (or linker attached to a ReAM) being attached via a single group (e.g. "monopodal" attachment) or multiple groups ("polypodal" attachment). In some embodiments, polypodal attachment, such as tripodal attachment, results in a more fixed orientation of the ReAM (including ReAM polymers) which can lead to higher density and cleaner signals. Polypodal (including tripodal) attachment moieties utilizing thiol, carboxylic acid, alcohol or phosphonic acids are particularly attractive. As outlined in the referenced application, some embodiments utilize attachment moieties based on triphenylmethane or tetraphenylmethane units, wherein 2 or 3 of the phenyl units are substituted with a suitable functional group for attachment (e.g. thiols such as Z-acetylthiol, or dihydroxylphosphoryl groups).

Linkers

Linkers are used in a variety of configurations in the present invention, including to link attachment moieties to the ReAMs of the invention, for linking together redox a active subunits of ReAMs, and in polymerization of ReAMs. Linkers are used in order to achieve fast writing and/or erasing at low voltages and a small cell size, the scaling of the linkers for use in the present invention can be optimized. Optimum linker size can be calculated theoretically (see U.S. Ser. No.>60/473,782, hereby expressly incorporated). Alternatively linkers (and in fact, the suitability of ReAMs as well) can be evaluated empirically simply by coupling the ReAM to the surface as described herein and in the cited references, and performing voltammetry to evaluate the electrochemical properties of the attached polymer.

Electrodes

The ReAM storage molecules of the invention are electrically coupled to electrodes. The term "electrode" refers to any medium capable of transporting charge (e.g. electrons)

to and/or from a storage molecule. Preferred electrodes are metals and conductive organic molecules, including, but not limited to, Group III elements (including doped and oxidized Group III elements), Group IV elements (including doped and oxidized Group IV elements), Group V elements (including doped and oxidized Group V elements) and transition metals (including transition metal oxides and transition metal nitrides). The electrodes can be manufactured to virtually and 2-dimensional or 3-dimensional shape (e.g. discrete lines, pads, planes, spheres, cylinders, etc.).

The term "fixed electrode" is intended to reflect the fact that the electrode is essentially stable and unmovable with respect to the storage medium. That is, the electrode and storage medium are arranged in an essentially fixed geometric relationship with each other. It is of course recognized that the relationship alters somewhat due to expansion and contraction of the medium with thermal changes or due to changes in conformation of the molecules comprising the electrode and/or the storage medium. Nevertheless, the overall spatial arrangement remains essentially invariant. In a preferred embodiment this term is intended to exclude systems in which the electrode is a movable "probe" (e.g. a writing or recording "head", an atomic force microscope (AFM) tip, a scanning tunneling microscope STM) tip, etc.).

The term "working electrode" is used to refer to one or more electrodes that are used to set or read the state of a storage medium and/or storage molecule.

The term "reference electrode" is used to refer to one or more electrodes that provide a reference (e.g. a particular reference voltage) for measurements recorded from the working electrode. In preferred embodiments, the reference electrodes in a memory device of this invention are at the same potential although in some embodiments this need not be the case.

Electrolytes

In some embodiments of the present invention, as is more fully described below, an electrolyte (dielectric) component is used. In general, electrolyte polymers are used to hold the electrolyte for electrochemical reaction. A wide variety of suitable electrolytes are known, including ceramics, metals, gels, fluids, etc. Nafion is a particularly useful example, and can be applied in a thin layer, approximately 1 nm to 1000 nm, preferably about 100 nm to about 500 nm, more preferably about 10 nm to about 100 nm and most preferably about one hundred nanometers thick.

Fabrication and Characterization of the Storage Device

The memory devices of this invention can be fabricated using standard methods well known to those of skill in the art. In a preferred embodiment, the electrode layer(s) are applied to a suitable substrate (e.g. silica, glass, plastic, ceramic, etc.) according to standard well known methods (see, e.g., Rai-Choudhury (1997) The Handbook of Microlithography, Micromachining, and Microfabrication, SPIE Optical Engineering Press; Bard & Faulkner (1997) Fundamentals of Microfabrication). A variety of techniques are described below and also in U.S. Pat. Nos. 6,212,093; 6,728,129; 6,451,942; 6,777,516; 6,381,169; 6,208,553; 6,657,884; 6,272,038; 6,484,394; and U.S. Ser. Nos. 10/040,059; 10/682,868; 10/445,977; 10/834,630; 10/135,220; 10/723,315; 10/456,321; 10/376,865; and U.S. Ser. No. 10/800,147, entitled Procedure for Preparing Redox-Active Polymers on Surfaces, Bocian, Liu and Lindsay, assigned to the Regents of the University of California, all of which are expressly incorporated by reference, in particular for the fabrication techniques outlined therein.

Architectures

As outlined herein, the ReAMs are assembled into storage media, generally as components of electrochemical cells. The term "storage medium" refers to a composition comprising two or more storage molecules. The storage medium can contain only one species of storage molecule or it can contain two or more different species of storage molecule. In preferred embodiments, the term "storage medium" refers to a collection of storage molecules. Preferred storage media comprise a multiplicity (at least 2) of different and distinguishable (preferably non-neutral) oxidation states. The multiplicity of different and distinguishable oxidation states can be produced by the combination of different species of storage molecules, each species contributing to the multiplicity of different oxidation states and each species having a single non-neutral oxidation state. Alternatively or in addition, the storage medium can comprise one or more species of storage molecule having a multiplicity of non-neutral oxidation states. The storage medium can contain predominantly one species of storage molecule or it can contain a number of different storage molecules. The storage media can also include molecules other than storage molecules (e.g. to provide chemical stability, suitable mechanical properties, to prevent charge leakage, etc.).

The term "electrochemical cell" typically refers to a reference electrode, a working electrode, a redox-active molecule (e.g. a storage medium), and, if necessary, some means (e.g., a dielectric or a conducting electrolyte) for providing electrical conductivity between the electrodes and/or between the electrodes and the medium. In some embodiments, the dielectric is a component of the storage medium.

The terms "memory element", "memory cell", or "storage cell" refer to an electrochemical cell that can be used for the storage of information. Preferred "storage cells" are discrete regions of storage medium addressed by at least one and preferably by two electrodes (e.g. a working electrode and a reference electrode). The storage cells can be individually addressed (e.g. a unique electrode is associated with each memory element) or, particularly where the oxidation states of different memory elements are distinguishable, multiple memory elements can be addressed by a single electrode. The memory element can optionally include a dielectric (e.g. a dielectric impregnated with counterions).

The term "storage location" refers to a discrete domain or area in which a storage medium is disposed. When addressed with one or more electrodes, the storage location may form a storage cell. However if two storage locations contain the same storage media so that they have essentially the same oxidation states, and both storage locations are commonly addressed, they may form one functional storage cell.

"Addressing" a particular element refers to associating (e.g., electrically coupling) that memory element with an electrode such that the electrode can be used to specifically determine the oxidation state(s) of that memory element.

The terms "read" or "interrogate" refer to the determination of the oxidation state(s) of one or more molecules (e.g. molecules comprising a storage medium).

The term "refresh" when used in reference to a storage molecule or to a storage medium refers to the application of a voltage to the storage molecule or storage medium to re-set the oxidation state of that storage molecule or storage medium to a predetermined state (e.g. an oxidation state the storage molecule or storage medium was in immediately prior to a read).

The term "E1/2" refers to the practical definition of the formal potential (E°) of a redox process as defined by $E=E°+(RT/nF)\ln(Dox/Dred)$ where R is the gas constant, T is temperature in K (Kelvin), n is the number of electrons involved in the process, F is the Faraday constant (96,485 Coulomb/mole), Dox is the diffusion coefficient of the oxidized species and Dred is the diffusion coefficient of the reduced species.

A "voltage source" is any source (e.g. molecule, device, circuit, etc.) capable of applying a voltage to a target (e.g. an electrode).

The phrase "output of an integrated circuit" refers to a voltage or signal produced by a one or more integrated circuit(s) and/or one or more components of an integrated circuit.

A "voltammetric device" is a device capable of measuring the current produced in an electrochemical cell as a result of the application of a voltage or change in voltage.

An "amperometric device" is a device capable of measuring the current produced in an electrochemical cell as a result of the application of a specific potential ("voltage") for a period of time.

A "potentiometric device" is a device capable of measuring potential across an interface that results from a difference in the equilibrium concentrations of redox molecules in an electrochemical cell.

A "coulometric device" is a device capable of the net charge produced during the application of a potential field ("voltage") to an electrochemical cell.

An "impedance spectrometer" is a device capable of determining the overall impedance of an electrochemical cell.

A "sinusoidal voltammeter" is a voltammetric device capable of determining the frequency domain properties of an electrochemical cell.

There are a wide variety of device and systems architectures that benefit from the use of molecular memory.

**TT

FIG. 1 shows a memory device 100 incorporating a molecular memory array 101. Molecular memory array 101 comprises an array of 2N rows and 2M column. Each of the 2N rows is associated with a word line 107, while each of the 2M columns is associated with a bit line 109. In a typical application the word lines 107 and bit lines 109 will intersect each other. A molecular memory device 300 (shown in FIG. 3) located at the intersection of each row and column. Molecular memory array 101 may include any number of molecular memory devices 300 arranged in any fashion that meets the needs of a particular application.

Memory device 100 is operated by receiving an N-bit row address into row address decoder 103 and an M-bit column address into column address decoder 105. row address decoder 103 generates a signal on one word line 107. Word lines 107 may include word line driver circuitry 115 that drives a high current signal onto word lines 107. Because word lines 107 tend to be long, thin conductors that stretch across much of the chip surface, it requires significant current and large power switches to drive a word lines signal. As a result, line driver circuits 115 are often provided with power supply 117 in addition to power supply circuits (not shown) that provide operating power for the other logic. Word line drivers 115, therefore, tend to involve large components and the high speed switching of large currents tends to create noise, stress the limits of power supplies and power regulators, and stress isolation structures.

In a conventional memory array there are more columns (bit lines) than rows (word lines) because during refresh operations, each word line is activated to refresh all of storage elements coupled to that word line. Accordingly, the fewer the number of rows, the less time it takes to refresh all of the rows. One feature of the present invention is that the molecular memory elements 300 can be configured to exhibit significantly longer data retention than typical capacitors, in the order of tens, hundreds, thousands or effectively, unlimited seconds. Hence, the refresh cycle can be performed orders of magnitude less frequently or omitted altogether. Accordingly, refresh considerations that actually affect the physical layout of a memory array 101 can be relaxed and arrays of various geometry can be implemented. For example, memory array 101 can readily be manufactured with a larger number of word lines, which will make each word line shorter. As a result, word line driver circuits 115 can be made smaller or eliminated because less current is required to drive each word line at a high speed. Alternatively or in addition, shorter word lines can be driven faster to improve read/write access times. As yet another alternative, each row of memory locations can be provided with multiple word lines to provide a mechanism for storing multiple states of information in each memory location Sense amplifiers 111 are coupled to each bit line 109 and operate to detect signals on bit lines 109 that indicate the state of a memory element 300 coupled to that bit line, and amplify that state to an appropriate logic level signal. In one embodiment, sense amplifiers 111 may be implemented with substantially conventional designs as such conventional designs will operate to detect and amplify signals from a molecular memory element 300. Alternatively, unlike conventional capacitors, some molecular storage elements provide very distinct signals indicating their state. These distinct signals may reduce the need for conventional sense amplifier logic as the state signal from a molecular storage device can be more readily and reliably latched into buffers of read/write logic 113 than can signals stored in conventional capacitors. That is, the present invention can provide devices which are sufficiently large as to obviate the need for a sense amplifier.

Read/write logic 113 includes circuitry for placing the memory device 100 in a read or write state. In a read state, data from molecular array 101 is placed on bit lines 109 (with or without the operation of sense amplifiers 111), and captured by buffers/latches in read/write logic 113. Column address decoder 105 will select which bit lines 109 are active in a particular read operation. In a write operation, read/write logic 113 drives data signals onto the selected bit lines 109 such that when a word line is activated, that data overwrites any data already stored in the addressed memory element(s) 300.

A refresh operation is substantially similar to a read operation, however, the word lines 107 are driven by refresh circuitry (not shown) rather than by externally applied addresses. In a refresh operation, sense amplifiers 111, if used, drive the bit lines 109 to signal levels indicating the current state of the memory elements 300 and that value is automatically written back to the memory elements 300. Unlike a read operation, the state of bit lines 109 is not coupled to read/write logic 113 during a refresh. This operation is only required if the charge retention time of the molecules used is less than the operational life of the device used, for example, on the order of 10 years for Flash memory.

FIG. 2 illustrates an exemplary embedded system 200 that comprises a central processing unit 201 and molecular memory 203. A memory bus 205 couples CPU 201 and molecular memory device 203 to exchange address, data, and control signals. Optionally, embedded system 200 may also contain conventional memory 207 coupled to memory bus 205. Conventional memory 207 may include random access memory (e.g., DRAM, SRAM, SDRAM and the like), or read only memory (e.g., ROM, EPROM, EEPROM and the like). These other types of memory may be useful for caching data molecular memory device 203, storing operating system or BIOS files, and the like. Embedded system 200 may include one or more input/output (I/O) interfaces 209 that enable CPU 201 to communicate with external devices and systems. I/O interface 209 may be implemented by serial ports, parallel ports, radio frequency ports, optical ports, infrared ports and the like. Further, interface 209 may be configured to communicate using any available protocol including packet-based protocols.

FIG. 3 illustrates a memory element 300 in accordance with an embodiment of the present invention. Memory element 300 is akin to a widely used one transistor on capacitor (1T1C) memory element design, however, differs in that a molecular storage device 301, is employed. In particular embodiments, the molecular storage device is implemented as a stacked structured formed subsequent to and above a semiconductor substrate having active devices formed therein. In other embodiments, the molecular storage device is implemented as a micron or nanometer sized hole in a semiconductor substrate have active devices formed therein. The molecular storage device is fabricated using processing techniques that are compatible with the semiconductor substrate and previously formed active devices in the semiconductor substrate. The molecular storage device comprises, for example, an electrochemical cell having two or more electrode surfaces separated by an electrolyte (e.g., a ceramic or solid electrolyte or by direct contact with a metal or semiconductor structure). Storage molecules (e.g., molecules having one or more oxidation states that can be used for storing information) are coupled to an electrode surface within the electrochemical cells. Examples of storage molecules include monomeric porphyrins, ferrocene-derivatived porphyrins, trimeric porphyrins, porphyrin polymers or triple-decker sandwich porphyrins, among other compounds. Examples of suitable storage molecules are described in greater detail hereinafter.

When a word line is activated, access transistor 303 is placed in a conductive state thereby coupling molecular storage device 301 to its associated bit line. In many cases, the signal generated by molecular storage 301 is not sufficient to drive conventional logic devices. A sense amplifier 315 detects the signal generated by molecular storage 301 and amplifies that signal to an appropriate logic level (i.e., a signal compatible with other system logic). For example, using porphyrin storage molecules it is possible to construct storage devices 301 with stable oxidation states at +0.55V, +0.48V, +0.39V, +0.17V, −0.05V and −0.18V. More or fewer stable oxidation states may be provided in a given embodiment. The storage molecules can be placed in a selected one of these oxidation states by application of an appropriate voltage to a bit line 109, and while activating an appropriate word line 107. Once the storage device 301 is placed in the desired oxidation state, it will remain in that oxidation state for tens, hundreds, thousands or an indefinite number of seconds in particular applications.

During reading, a word line 107 is activated and the storage device 301 drives the bit line to a voltage that indicates its oxidation state. This is done in a manner very similar to that in which a capacitor performs the same operation. When the gate transistor is opened, the molecular storage device (MSD) is connected to the bit line. For example, the molecule has been written into an oxidized state, if the bit line is precharged to a value that is more negative than the oxidation potential of the molecule (with reference to the top metal of the MSD or counter electrode), and that molecule is in an oxidized state, current will flow from the molecule to the bit line (and electrons will flow from the bit line to the molecule) and the molecule is reduced once the transistor is closed. This will result in an accumulation of charge on the bit line, where the magnitude of the charge is determined by the number of molecules on the MSD and the oxidation state of each molecule ($Q=nFN$, Faraday's Law). The appearance of that charge will change the voltage on the bit line ($V=Q/C$), and that change in voltage can be distinguished by a voltage-sensing amplifier, as conventionally used in the art.

The bit line voltage during a read operation may vary from the oxidation state voltages due to parasitic effects and loading of the read circuitry, however, the circuitry is arranged to allow the stable oxidation states to be read distinctly. The bit line voltage may be read directly by external logic, or may be amplified to more conventional logic levels by sense amplifier 315. In particular implementations, the sense amplifier 315 may include multiple reference points (e.g. a multi-state sense amplifier) so that it produces stable multi-valued signals on the bit line. Alternatively, sense amplifier 315 may include analog-to-digital functionality that produces a plurality of logic-level binary outputs in response to the multi-value voltage signal read from a particular memory element 300.

FIG. 4 illustrates an exemplary timing diagram for a read operation during operation of a memory in accordance with the present invention. The timing diagram of FIG. 4 is provided by way of example to show operation of an implementation that is analogous to a conventional DRAM operation. Other signal formats and control protocols are known and the present invention is readily adapted to these other formats. As shown in FIG. 4, row and column addresses are communicated in two phases. Row addresses are placed on the address bus, and a row address strobe (RAS) is generated, for example, by read/write logic 113. When the RAS signal transitions between times t1 and t2 when the row address is latched into row address decoder 103 (shown in FIG. 1) and a word line 107 is selected. RAS is held in the active state until the transition at t7-t8. In response to activation of the word line, sense amplifiers 111 operate to drive the bit lines to appropriate logic level signals.

At time t3 a write enable (WE) strobe is transitioned to an inactive state where it remains until the end of the write cycle at t10. The WE transition prevents the molecular array from being written to. Subsequently, column address are presented on the address bus. When the column address is stable, the column address strobe (CAS) transitions at times t4-t5 to initiate the capture and decoding of the column address by column address decoder 105 (shown in FIG. 1). After time t5, a bit line 109 or set of bit lines 109 is/are selected and remains selected until the CAS signal is removed by the CAS transition at times t8-t9. An output enable (OE) signal transitions to couple the selected bit lines 109 to the data I/O ports. At time t6 the valid data appears on the data lines. Valid data remains through the transitions of the RAS and CAS and WE signals to an inactive state.

Figure 6:
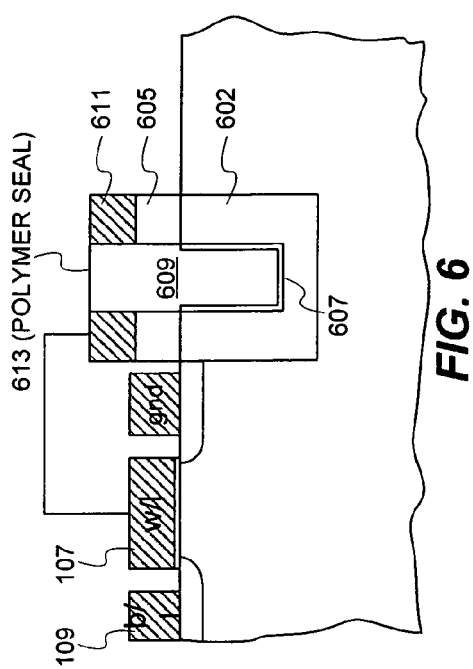
FIG. 6 shows a simplified cross-section of a "molehole" embodiment molecular storage device.

In the particular examples, the molecular storage device 301 is configured as an electrochemical cell having a reference electrode and a working electrode coupled through an electrolyte. FIG. 5 shows a stacked configuration for construction of a molecular storage device while FIG. 6 illustrates a trench or "molehole" implementation. In the stacked implementation of FIG. 5, the entire structure may be built on top of and electrically coupled to an electrode of an underlying semiconductor device. For example, conductive via or plug 501 may reach down through passivation and planarization layers of a semiconductor device to make electrical contact with a source/drain region of an access transistor 303. Conductive plug 501 may couple to a metal bond pad, or to the active region of a semiconductor device. In a particular example, plug 501 comprises tungsten, but may be manufactured using any metal, alloy, silicide, or other material that is available for implementing electrical connectivity.

Working electrode 503 comprises, for example, silicon, copper, aluminum, gold, silver, or other available conductor. While the working electrode may be a metal, it can also be a metaloxide, semiconductor or doped semiconductor. Other suitable materials include: Ti, Ta, TiO2, TaO2, SiO2, W, WOX and the like. Working electrode 503 is preferably formed at the same time as other structures such as bond pads and interconnects for an integrated circuit. Processes and materials for forming plugs 501 and electrodes 503 are widely available in the semiconductor processing industry. In many integrated circuit processes, metal pads will be coated with insulating layer 505 which serves to protect and/or passivate working electrode 503. Insulating layer 505 may be implemented as a deposited oxide, silicon nitride, or the like. Layer 505 is patterned to expose a portion of working electrode 503, preferably in the same operation used to expose portions of bonding pads of the integrated circuit. The exposed portion of working electrode 503 defines an active area for the molecular storage device 301. It is contemplated that the present invention can be manufactured up through the formation and patterning of oxide 505 using industry standard process flows.

A thin layer 507 of storage molecules is formed on the active area of working electrode 503. This layer may range in thickness from 0.1 to 100 nanometers in particular examples. It is desirable to implement layer 507 as a self assembling monolayer (SAM). The active area of the molecules is lithographically defined by patterning layer 505 over the conductive material. An extensive library of derivatized porphyrins (~250 compounds) is available as storage molecules for attachment to metalelectrodes suitable for use in layer 507. These compounds may comprise any of five different architectures: (1) monomeric porphyrins with different types of tethers, (2) ferrocene-derivatized porphyrins, (3) wing-shaped trimeric porphyrins, (4) porphyrin polymers, and (5) triple-decker sandwich porphyrins and polymers thereof. All of these porphyrinic architectures were found to form excellent quality self-assembled monolayers (SAMs). Once the molecules are attached, a thin (e.g., 50 to 200 nanometer) layer of metal, metaloxide or conductive electrolyte is applied to form electrolyte 509. Electrolyte 509 is the electrolyte for the oxidation-reduction cell. A metal layer 511 is deposited by evaporation, sputtering, or other deposition technique on to electrolyte layer 509. Metal layer 511 forms a reference electrode or counter electrode of the oxidation-reduction cell and comprises any well behaved electrochemical counter electrode material such as copper, silver, platinum and the like. Economics and semiconductor processes already developed will determine the metal of choice in a particular application.

In operation, storage molecules 507 are attached to and electrically coupled to the working electrode 503. The electrolyte 509, which may be a liquid, gel, or solid that is chemically compatible with the storage molecules and other conductors and insulators used in the device. Electrolyte 509 enables the transport of charge between the working and reference electrodes. For any given oxidation state and choice of storage molecules the electrochemical cell exhibits a distinctive electrochemical potential called the half-wave potential (E1/2) or equilibrium potential. A given molecular storage device 301 will have two, three, four, or more distinctive E1/2's depending on the particular storage molecules chosen. This offers the potential of manufacturing a single infrastructure including read/write logic, address decoders, interconnect circuitry and the like that can be customized at a late state of manufacture by selecting the particular storage molecules for the device. Some adjustment of the electronics will be required to compensate for the particular characteristics of the chosen storage molecule, however, the manufacturing advantages are clear.

One advantage of the stacked architecture shown in FIG. 5 is that the bottom surface of the capacitor forms the electrode surface, and storage molecules are able form monolayers on this surface. Also, electrolyte layer 509 coats the storage molecules, essentially encapsulating them and protecting them from subsequent steps. Moreover, metal is never deposited directly onto the molecular layer, thereby preventing damage and other problems associated architectures that expose the storage molecules during or after processing to metal contamination. Further, the structure of FIG. 5 provides an easy way to implement a three-dimensional architecture in that subsequent layers of metal, insulator and the like are added after manufacture of the underlying semiconductor-based microelectronic devices while also preventing short-circuits.

FIG. 6 illustrates an implementation of a storage device 301 in which an electrochemical cell is formed in a trench structure, also called a "molehole" structure. A trench extends into substrate 601, through an overlying dielectric layer 605 (e.g., oxide) and counter electrode 611. The walls of the trench are exposed and provides a surface contact to which storage molecules 607 can be assembled. Storage molecules 607 and electrolyte 609 are added and the structure then be covered by a polymer 613 to seal the array.

Each word line 107 is connected to the counter electrode 611 of the memory cells in a row, while each bit line is connected to the drains of the memory cells in a column. The ground voltage is connected to the source regions of the memory cells in a selected row. The row address decoder 103 (shown in FIG. 1) will activate all access transistors 303 in a selected row thereby coupling each storage device 301 in that row to their respective bit lines. The word lines 107 and bit lines 109 are manufactured using low temperature oxide deposition and metallization such that the integrity of the storage molecules 607 is preserved. In may be preferred to use room temperature deposition of silicon dioxide and metals to form these structures. Existing molecules are able to withstand temperatures in excess of 400 degrees Celsius, allowing a broad range of temperatures for subsequent processes.

The trench architecture shown in FIG. 6 avoids the possibility of metal being deposited onto the molecular layer, thereby preventing damage and other problems associated with other proposed architectures. The inside of the trench forms the electrode surface, and molecules form SAMs on the inside of the cylinder, hence, the number of molecules can be increased by increasing the depth of the trench. The height of each layer of metal determines the height of the trench, thereby allowing easy adjustment of the effective area of the two terminals. Because the vertical dimension is used, many more molecules (30 times that of a simple crossbar for a 200 nm thick electrode) are available for writing/reading. This allows greatly enhanced sensitivity for a given cross-sectional area. In addition, the design of FIG. 6 easily accomplishes any variation in the relative sizes of each electrode. The effective capacitance of each junction is diminished by the removal of a large area of dielectric between the two metal plates at each intersection. This may have an effect on the overall wire capacitance; however, if the lines are sufficiently thick, the wire resistance will not be impacted significantly.

One advantage of molecular storage devices 301 is that molecular storage can readily be adapted to store multiple bits of data at each location by selection of the storage molecules. FIG. 7 is a cyclic voltammogram that illustrates a current-voltage characteristic of a two-state monomeric porphyrin storage molecule. The peaks and valleys correspond to distinct oxidation states that can be used for storing information. In the example of FIG. 7, two peaks correspond to two distinct oxidization states and therefore a storage device 301 that is capable of storing two states of information. Each oxidation state can be set or written to independently of the other. The lower portion of the cyclic curve corresponds to writing data to a molecular storage device 301 whereas the upper portion of the cyclic curve corresponds to reading data from a molecular storage device 301.

In order to write a state into the storage device 301 a voltage is applied to the bit line to create the desired oxidation state of the storage molecules. Typically, the voltage applied to the bit line will be somewhat more positive than the E1/2 of the molecule used in the MSD to compensate for resistive and capacitive losses in the writing circuitry. The losses associated with the writing circuitry are measurable and consistent, and so can be readily compensated. In a specific embodiment, the working electrode 503/602 is held at a ground potential and the reference electrode 511/611 is placed at a bias potential slightly below a peak in the IV curve shown in FIG. 7. The bit lines 109 are coupled to a write signal that indicates a first logic state with a voltage that when added to the bias potential is insufficient to cause oxidation of the storage molecules. The write signal indicates a second logic state with a voltage that when added to the bias potential is sufficient to cause oxidation of the storage molecules.

In the specific example of FIG. 7, the bias potential on reference electrode 511/611 is set at 500 mV and the data signal applied to a bit line is either 0 or 300 mV. A 500 mV signal is insufficient to cause oxidation, whereas an 800 mv signal is sufficient to cause oxidation of the first discrete oxidation state. To write a second state to the same storage device 301, the bias potential on reference electrode 511/611 is set above 800 mV. Once again, the data signal applied to a bit line is either 0 or 300 mV. An 800 mV signal is insufficient to cause oxidation, whereas an 1100 mV signal is sufficient to cause oxidation of the second discrete oxidation state. Hence, the first and second bits can be written subsequently.

After a write operation, the storage molecules will tend to remain at their oxidation state. In essence, the electrons added, or removed, by the write process are tightly bound to the storage molecules. In contrast, conventional solid state capacitors have electrons loosely captured in energy bands, where they are much more likely to escape. As a result, charge stored in storage molecules is much slower to leak away as compared to charge stored in a conventional capacitor. Once the storage molecules are written to a given oxidation state, they can be read by either voltage-mode sense amplifiers or current-mode sense amplifiers.

As shown in FIG. 7, one characteristic of storage molecules is that if a voltage is applied to molecular storage device 301, the current magnitude will vary distinctively depending on the oxidation state of the storage molecules. A peak in the CV curve shown in FIG. 7 corresponds to a particular oxidation state. If the storage molecules are already set at that particular oxidation state, no current will pass. For example, the storage device 301 can be read by applying a voltage between the reference electrode and the working electrode more positive than the characteristic peak in the CV curve shown in FIG. 7 and comparing the current to a reference current source. A relatively large current indicates a first logic state while a relatively low current indicates a second logic state. In this manner, the oxidation state of the storage molecules after a write is determined by the state of the write signal coupled to the bit line. Although the exemplary implementations write each bit serially, it is contemplated that the molecules can be written to and/or read from in parallel.

This reading methodology is partially or wholly destructive in that application of a potential during reading will alter the oxidation state of at least some storage molecules the storage device 301. Accordingly, a read operation is desirably followed by a write back to the molecular storage device 301 to restore the oxidation state of the storage molecules.

FIG. 8 illustrates a storage molecule having five discernable oxidation states, each indicated by a peak in the CV curve shown in FIG. 8. Molecular storage promises great expansion in information density because storage molecules can be designed to with almost any number of distinct oxidation states. As each oxidation state is capable of storing one bit if information the information density of a memory array increases dramatically. By implementing read/write logic, sense amplification mechanisms and the like that support molecular storage the present invention enables the use of these properties in practical memory devices.

FIG. 9 illustrates an alternative view of the CV relationship of a storage device 301 having multiple distinct oxidation states. At any particular voltage the current is determined by the various oxidation states. Accordingly, reading a storage device 301 can be accomplished by applying a particular voltage to the storage device 301, measuring the current, and mapping the measured current to an appropriate logic state for the number of bits stored in the storage device 301.

FIG. 10 shows an exemplary current sense amplifier arrangement applicable to a multi-state molecular memory, although alternatively, a voltage sensing technique may likewise be employed. The arrangement shown in FIG. 10 implement parallel current sensing. The cell current (ICELL) is coupled to a current-mode sense amplifier 1001. Cell current may be directly from a bit line 109, or may instead by pre-amplified. A pre-amplifier may be included within each current mode sense amplifier 1001 or provided separately. Each sense amplifier 1001 has a unique current referenced 1003 which indicates a threshold current value for a particular logic state. Each sense amplifier 1001 generates a binary signal indicating whether the cell current exceeded the reference current. Logic encoder 1005 receives the binary signals and maps them to logic signals, which may include level shifting, inverting, or processing with other combinatorial logic to meet the needs of a particular application.

FIG. 11 illustrates a 1 Mbit implementation combining many of the molecular storage device features described hereinbefore into a practical large capacity memory. The layout shown in FIG. 11 follows industry standard pin out to the extent practicable. However, where multiple states are stored in each cell, it may be desirable to provide multiple pin outs so that data can be read out in parallel so that the read out consumes fewer clock cycles. The particular implementation of FIG. 11 uses four banks of memory cell arrays 1101 where each bank implements 256K memory locations arranged as 512 rows and 512 columns. The entire device shown in FIG. 11 has 512 rows×2048 columns or 1048576 locations (i.e., a 1 Mbit memory). Other arrangements of any size can be readily substituted for the particular arrangement shown in FIG. 11. To ease illustration, common chip inputs such as power supply voltages and ground are omitted.

An eight bit row address is supplied by an external device on the RA<0:8> input to row pre-decoder 1103'. Row pre-decoder partially decodes the row address and supplies the partially decoded output to each of row decoders 1103. A row decoder 1103 is supplied for each bank whereas the row pre-decoder 1103' is typically shared amongst all of the banks. Row pre-decoder 1103 enables row decoders 1103 to be smaller and generally faster because they are processing addresses that are partially decoded. In the particular embodiment of FIG. 11, row decoders 1103 include word line driver circuitry for each word line. Column addresses are provided to the CA<0:8> input pin to a column address pre-decoder 1105'. Column address pre-decoder 1105' supplies pre-decoded addresses to column decoder 1105, which generates the completely decoded addresses.

Each memory array 1101 includes 512 word lines 1107. A particular bank is selected for reading and/or writing by an appropriate signal placed on one of the DBLA lines shown in the upper portion of FIG. 4 which activates the bit line addressed by the column decoder 1105. A bit line reference voltage VBLREF is supplied to each of the sense amplifier modules 1111. The bit line reference voltage can be used for a voltage-mode sense amplification, or used to drive serial or parallel current-mode sense amplification.

Each memory array 1101 is provided with a sense amplification module 1111 which includes sense amplification circuitry coupled to the 512 bit lines of memory array 1101. Sense amplification module 1111 may also include write pass gates which enable data being written to memory array 1101 to bypass the sense amplifiers, as well as pre-charge pass gates which enables a bit line pre-charge signal (if used) to bypass the sense amplifiers. Bit line pre-charge is a useful technique for reducing the response time of bit lines by placing them at a potential just before reading that is midway between a high an low logic signal. This technique enables the bit line to respond more quickly because of the reduced voltage swing.

Data buffers 1103 serve to drive data signals onto bit lines during write operations, and to read data signals from bit lines during read operations. Logic 1005 for encoding multiple bits of data may be included in data buffer module 1103. Write data is received on the D<> inputs and read data output is placed on the Q<1>−Q<3> outputs. Although the implementation of FIG. 11 is generalized, it is apparent that the present invention enables the adaptation of DRAM circuit techniques and functional components to operate a molecular memory. This, in turn, existing circuit techniques to be leveraged into the much higher density provided by molecular storage devices.

Multi-electrode molehole arrays are well suited for use as memory elements in molecular based electronic devices and may be utilized in implementing the molecular memory arrays and devices of the present invention. In "molecular memory" elements redox-active molecules (molecules having one or more non-zero redox states) coupled to an electrode (e.g. the working electrode) in a molehole are used to store bits (e.g. in certain embodiments, each redox state can represent a bit or a combination of bits). The redox-active molecule attached to the electrode (e.g. silicon or germanium) forms a storage i cell capable of storing one or more bits in various oxidation states. In certain embodiments, the storage cell is characterized by a fixed working electrode electrically coupled to a "storage medium" comprising one or more redox-active molecules and having a multiplicity of different and distinguishable oxidation states. Data is stored in the (preferably non-neutral) oxidation states by the addition or withdrawal of one or more electrons from said storage medium via the electrically coupled electrode. The oxidation state of the redoxactive molecule(s) can be set and/or read using electrochemical methods (e.g. cyclic voltammetry), e.g., as described in U.S. Pat. Nos. 6,272,038, 6,212,093, and 6,208,553 and PCT Publication WO 01/03126, the disclosures of which are herein incorporated by this reference in their entirety. A molehole array comprising a plurality of moleholes (electrochemical cells) can provide a high capacity, high density memory device.

Because group N elements, in particular silicon and germanium, are commonly used in electronic chip fabrication, they readily lend themselves to the fabrication of molecular memory chips compatible with existing processing/fabrication technologies. In addition, details on the construction and use of storage cells comprising redox-active molecules can be found, in U.S. Pat. Nos. 6,272,038, 6,212, 093, and 6,208,553 and PCT Publication WO 01/03126.

What is claimed is:

1. A molecular storage device, comprising an electrochemical cell built on top of and electrically coupled to an electrode of a switching device, wherein the electrochemical cell includes:
   a working electrode;
   a plurality of storage molecules that are covalently bonded to the working electrode and that comprise a storage medium having a plurality of redox-active molecules and a multiplicity of different and distinguishable oxidation states;
   a reference electrode; and
   an electrolyte that supports ionic current between the working electrode and the reference electrode.

2. A molecular storage device, comprising an electrochemical cell built on top of and electrically coupled to an electrode of a switching device, wherein the electrochemical cell includes:
   a working electrode;
   a plurality of storage molecules that are attached and electrically coupled to the working electrode;
   a reference electrode; and
   an electrolyte that supports ionic current between the working electrode and the reference electrode.

3. The device of claim 2, wherein the plurality of storage molecules comprise a storage medium having a plurality of redox-active molecules and a multiplicity of different and distinguishable oxidation states.

4. The device of claim 2, wherein the storage molecules are covalently bonded to the working electrode.

5. The device of claim 2, wherein the storage molecules are monomeric porphyrins, ferrocene-derivatized porphyrins, trimeric porphyrins, porphyrin derivatives, or porphyrin polymers.

6. The device of claim 2, wherein the working electrode comprises Al, Au, Ag, Ti, W, Cu, oxides thereof or nitrides thereof.

7. A memory element, comprising:
a switching device;
a bit line coupled to the switching device;
a word line coupled to the switching device; and
an electrochemical cell built on top of and electrically coupled to an electrode of the switching device, wherein the electrochemical cell includes:
a working electrode;
a storage medium comprising one or more redox-active molecules and a multiplicity of different and distinguishable oxidation states that is attached and electrically coupled to the working electrode;
a reference electrode; and
an electrolyte that supports ionic current between the working electrode and the reference electrode.

8. A memory element, comprising:
a switching device;
a bit line coupled to the switching device;
a word line coupled to the switching device; and
an electrochemical cell built on top of and electrically coupled to the switching device, wherein the electrochemical cell includes:
a working electrode;
a plurality of storage molecules that are attached and electrically coupled to the working electrode;
a reference electrode; and
an electrolyte that supports ionic current between the working electrode and the reference electrode.

9. The memory element of claim 8, wherein the memory element has a charge retention time greater than 64 milliseconds.

10. The memory element of claim 8, comprising a sense amplifier coupled to the bit line.

11. A memory array, comprising an array of memory elements, wherein at least some of the memory elements comprise
an electrochemical cell built on top of and electrically coupled to an electrode of a switching device, wherein the electrochemical cell includes:
a working electrode;
a plurality of storage molecules that are attached and electrically coupled to the working electrode;
a reference electrode; and
an electrolyte that supports ionic current between the working electrode and the reference electrode.

12. The memory array of claim 11, wherein the array comprises at least 250,000 memory elements.

13. The memory array of claim 11, comprising sense amplifiers and pre-charge pass gates that enable a bit line pre-charge signal to bypass the sense amplifiers.

14. A computing device, comprising a central processing unit coupled to a molecular memory that includes an array of memory elements, wherein at least some of the memory elements comprise an electrochemical cell built on top of and electrically coupled to an electrode of a switching device, wherein the electrochemical cell includes:
a working electrode;
a plurality of storage molecules that are attached and electrically coupled to the working electrode;
a reference electrode; and
an electrolyte that supports ionic current between the working electrode and the reference electrode.

15. The computing device of claim 14, wherein the switching device is a transistor.

16. A method of reading a molecular memory device, comprising:
coupling a bit line via a switching device to an electrochemical cell that is built on top of and electrically coupled to an electrode of the switching device, wherein the electrochemical cell includes:
a working electrode;
a plurality of storage molecules that are attached and electrically coupled to the working electrode;
a reference electrode; and
an electrolyte that supports ionic current between the working electrode and the reference electrode; and
driving the bit line to a voltage indicative of the oxidation state of the storage molecules.

17. A method of writing to a molecular memory device, comprising:
coupling a bit line via a switching device to an electrochemical cell that is built on top of and electrically coupled to an electrode of the switching device, wherein the electrochemical cell includes:
a working electrode;
a plurality of storage molecules that are attached and electrically coupled to the working electrode;
a reference electrode; and
an electrolyte that supports ionic current between the working electrode and the reference electrode; and
applying a voltage to the bit line to set the oxidation state of the storage molecules.

* * * * *